United States Patent
Bubar et al.

(10) Patent No.: US 10,072,997 B2
(45) Date of Patent: Sep. 11, 2018

(54) SAFETY SWITCH WITH IMBALANCE TEST

(71) Applicant: Rockwell Automation Technologies, Inc., Mayfield Heights, OH (US)

(72) Inventors: Todd Bubar, Hollis, NH (US); Andrew L. Tsang, Lowell, MA (US); Burt Sacherski, Nashua, NH (US); Steven Robert Tambeau, Marlborough, MA (US); Arvind Ananthanarayanan, Medford, MA (US); James Edward Dogul, Hudson, NH (US); Timothy P. Wolfe, Somerville, MA (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 15/592,399

(22) Filed: May 11, 2017

(65) Prior Publication Data

US 2017/0248481 A1    Aug. 31, 2017

Related U.S. Application Data

(63) Continuation-in-part of application No. 14/943,650, filed on Nov. 17, 2015, now Pat. No. 9,824,841.

(30) Foreign Application Priority Data

Nov. 17, 2016   (CN) .......................... 2016 1 1013598
Nov. 17, 2016   (EP) ..................................... 16199315

(51) Int. Cl.
*G08B 21/00*     (2006.01)
*G01L 5/10*      (2006.01)
(Continued)

(52) U.S. Cl.
CPC ................ *G01L 5/10* (2013.01); *G01L 1/225* (2013.01); *G08B 21/182* (2013.01);
(Continued)

(58) Field of Classification Search
None
See application file for complete search history.

(56) References Cited

U.S. PATENT DOCUMENTS

| 4,367,459 A | 1/1983 | Amir et al. |
| 4,736,194 A | 4/1988 | Sticksel |

(Continued)

FOREIGN PATENT DOCUMENTS

| AU | 2007311656 | 4/2008 |
| CA | 2380585 | 10/2003 |

(Continued)

OTHER PUBLICATIONS

Wikipedia, Safety integrity level, Last edited Feb. 26, 2017, Last visited Mar. 14, 2017 https://en.wikipedia.org/wiki/Safety_integrity_level.

(Continued)

*Primary Examiner* — Thomas McCormack
(74) *Attorney, Agent, or Firm* — Kunzler, PC

(57) ABSTRACT

An apparatus for an imbalance test includes a strain measurement module that measures a strain voltage across terminals of a strain gauge. The strain voltage is representative of an amount of force on the strain gauge. The apparatus includes a test measurement module that measures a test voltage across the terminals of the strain gauge while a test resistor is connected in parallel with a resistor of the strain gauge. The test resistor is connected while the test measurement module measures the test voltage and is disconnected while the strain module measures strain voltage. The apparatus includes an average module that calculates an (Continued)

average strain voltage from two strain voltage measurements. The strain voltages are measured preceding and after the test voltage measurement. The apparatus includes a difference module that determines a difference voltage. The difference voltage is a difference between the average strain voltage and the test voltage.

17 Claims, 21 Drawing Sheets

(51) Int. Cl.
 *G01L 1/22* (2006.01)
 *H01H 17/16* (2006.01)
 *G08B 29/18* (2006.01)
 *G08B 21/18* (2006.01)

(52) U.S. Cl.
 CPC ........... *G08B 29/185* (2013.01); *H01H 17/16* (2013.01); *H01H 2235/01* (2013.01)

(56) References Cited

U.S. PATENT DOCUMENTS

| | | | |
|---|---|---|---|
| 4,825,069 | A | 4/1989 | Hutchisson |
| 4,829,287 | A | 5/1989 | Kerr et al. |
| 4,929,926 | A | 5/1990 | Porat |
| 5,236,144 | A | 8/1993 | Kautz |
| 5,371,488 | A | 12/1994 | Couch et al. |
| 5,665,947 | A | 9/1997 | Falcon |
| 6,087,934 | A | 7/2000 | Golab |
| 6,348,911 | B1 | 2/2002 | Rosenberg et al. |
| 6,644,465 | B1 | 11/2003 | Dube |
| 7,134,241 | B2 | 11/2006 | Suzuki |
| 7,222,839 | B2 | 6/2007 | Taylor et al. |
| 7,271,355 | B2 | 9/2007 | Yu |
| 8,089,012 | B2 | 1/2012 | Mohtasham |
| 8,118,152 | B2 | 2/2012 | Poyner et al. |
| 8,591,198 | B2 | 11/2013 | Kochan, Jr. et al. |
| 2002/0035878 | A1 | 3/2002 | Norton |
| 2005/0121301 | A1 | 6/2005 | Hall et al. |
| 2008/0095196 | A1 | 4/2008 | Weatherhead et al. |
| 2008/0098401 | A1 | 4/2008 | Weatherhead et al. |
| 2008/0289937 | A1 | 11/2008 | Poyner |
| 2009/0083956 | A1 | 4/2009 | Ulfik et al. |
| 2010/0030345 | A1 | 2/2010 | Cole et al. |
| 2012/0061633 | A1 | 3/2012 | Holley |
| 2015/0014904 | A1 | 1/2015 | Tirelli |

FOREIGN PATENT DOCUMENTS

| | | |
|---|---|---|
| CN | 201029085 | 2/2008 |
| CN | 101565128 | 10/2009 |
| CN | 201882596 | 6/2011 |
| CN | 202481719 | 10/2012 |
| CN | 103528742 | 1/2014 |
| DE | 202007013591 | 1/2008 |
| EP | 1101681 | 11/2003 |
| JP | 2000106051 | 4/2000 |
| JP | 2007052278 | 3/2007 |
| WO | 1997020334 | 6/1997 |
| WO | 2002095779 | 11/2002 |
| WO | 2010137998 | 12/2010 |
| WO | 2012047117 | 4/2012 |

OTHER PUBLICATIONS

IDEM Safety Switches Limited, Guardian Line Series Grab Wire Safety Rope Switches, Last visited Mar. 14, 2017 http://www.idemsafety.com/products.asp?catid=29.
EN ISO 13849-1, Safety Performance Levels; Allen-Bradley; Apr. 2009; 26 pages.
U.S. Appl. No. 14/943,650, filed Nov. 17, 2015, Restriction Requirement Office Action dated Dec. 13, 2016.
U.S. Appl. No. 14/943,650, filed Nov. 17, 2015, Notice of Allowance dated Apr. 19, 2017.
Partial European Seacrh Report; EP 16199315; dated Feb. 5, 2017.
Extended European Search Report, Application No. 16199315.9, dated Jul. 20, 2017.

| | OUTPUTS | | | INPUTS | | | |
|---|---|---|---|---|---|---|---|
| STATE | OSSD | AUX | LED | E-STOP | RESET BUTTON | TENSION | NOTES |
| INITIALIZATION | OFF | ON | YELLOW | INACTIVE | INACTIVE | ANYTHING | JUST POWERED UP, SELF CHECKS |
| OFF | OFF | ON | RED | INACTIVE | INACTIVE | NOT NOMINAL | CHECKS TENSIONING, MOVES TO TENSIONED OFF IF APPROPRIATE |
| TENSIONED OFF | OFF | ON | RED/YELLOW | INACTIVE | INACTIVE | NOMINAL | HIT RESET GO TO TENSIONED RUN |
| TENSIONED RUN | ON | OFF | SOLID GREEN | INACTIVE | INACTIVE | NOMINAL | HIT E-STOP, PULL, OR SLACK TO OFF |
| PULLED | OFF | ON | SOLID RED | INACTIVE | INACTIVE | TRIP + OR VELOCITY | GOES TO OFF |
| SLACK | OFF | ON | BLINKING RED | INACTIVE | INACTIVE | TRIP − | GOES TO OFF |
| MARGINAL TENSION RUN | ON | OFF | BLINKING GREEN | INACTIVE | INACTIVE | MARGINAL + OR − | TENSIONING ADJUSTMENT NEEDED |

FIG. 12

SAFETY SWITCH WITH IMBALANCE TEST

CROSS-REFERENCE TO RELATED APPLICATIONS

This is a continuation-in-part application of and claims priority to U.S. patent application Ser. No. 14/943,650 entitled "SAFETY SWITCH AND ASSOCIATED METHODS" and filed on Nov. 17, 2015 for Andrew L. Tsang, et al., which is incorporated herein by reference.

FIELD

The present disclosure generally relates to a safety switch, and more particularly to a cable pull safety switch with a strain gauge imbalance test.

BACKGROUND INFORMATION

Emergency stop devices are devices that help ensure safe working conditions for personnel working in and around machinery. Such machinery may exist, for example, in factory settings, manufacturing settings, agricultural settings, foundry settings, warehouse settings, or other industrial settings. Often, the machinery (e.g., industrial presses, die machines, milling machines, molding machines, robotics, conveyor belts, etc.) may include moving parts or other hazards that can be dangerous to the personnel working around the machinery. In the event of a dangerous situation where the safety of a worker may need to be maintained, an emergency stop device can be actuated to immediately cease operation of the particular machine. By providing one or more emergency stop devices within quick reach of workers, injury can be avoided or mitigated.

One commonly used emergency stop device is a cable pull switch (also called a grab wire switch, a safety rope switch, or other similar names). A cable pull switch is coupled to one or both ends of a relatively inelastic cable (e.g., a steel cable). When properly installed, pull cable exerts a tension on the cable pull switch. So configured, a long distance (e.g., 100 meter or more) of pull cable can provide a nearly continuous emergency stop function that is easily activated around machinery or along conveyor belts. Any notable deflection or force exerted on the pull cable (e.g., by a worker pulling on the pull cable) can trigger the cable pull switch to effect an emergency stop of the machinery or equipment to which it is connected.

Existing cable pull switches utilize mechanical contact blocks with binary on/off or open/closed states. These existing cable pull switches act like a snap action switch where a transition between an on and off state occurs almost instantaneously in reaction to the worker pulling the pull cable. When a worker pulls the pull cable, a portion of the pull cable is deflected, which results in a linear displacement of the end of the pull cable coupled to the cable pull switch. When the linear deflection at the cable pull switch exceeds a threshold, the contact blocks become activated (e.g., with snap action) and the emergency stop is implemented. Additionally, many cable pull switches protect against pull cable failure by implementing an emergency stop if the pull cable enters a slack condition (e.g., not enough tension exerted by the pull cable on the switch) or a cut condition (no tension on the cable and none at the switch). To implement this, existing pull switches may have a second mechanical contact block that becomes activated when the linear displacement of the end of the cable connected to the pull cable is reduced by action of a tensioning spring within the cable pull switch as the cable enters the slack or cut condition, or utilize an unstable system where too much or too little tension causes a mechanism to actuate the contact block.

The linear physical positions of the activation points of the contact blocks and mechanism dictate the thresholds of operation of the cable pull switch. These thresholds are not easily altered, and therefore require careful adjustment of the tension of the pull cable during operation and repeated checks and adjustments over the lifetime of the pull cable installation (for example, as the cable stretches to generate slack or as the temperature changes in a particular application setting). Existing cable pull switches utilize a mark on the movable portion of the cable pull switch (e.g., a shaft connected to the pull cable), which is then compared to a mark on the cable pull switch body to determine if a length of the pull cable is adjusted such that the proper tension is exerted on the pull cable by the cable pull switch. The tension of the pull cable is often adjusted with one or more turnbuckles or with a cable tensioning system. Though suitable for at least some purposes, such approaches do not necessarily meet all needs of all application settings and/or all users. For example, a technician installing or adjusting the tension on the pull cable may have to adjust elements that are located a distance from the cable pull switch (e.g., 25 meters or more), in which case the technician (e.g., if working alone) would have to iteratively walk between the adjustment location and the cable pull switch to properly adjust the tension.

Further, because the positions of the activation points of the contact blocks dictate the thresholds of operation of the cable pull switch, tension on the pull cable may have to be adjusted more often to account for thermal expansion/contraction. The thresholds are often fairly close together to allow for easy detection of a pull on the cable, thereby creating a safer environment. However, the close threshold may create a false trigger situation if the pull cable were to expand or contact due to thermal changes.

Additionally, present cable pull switches are susceptible to jamming or other conditions rendering the cable pull switch incapable of registering a cable pull event. For example, a shaft of the cable pull switch may become deformed or damaged or the cable may become pinched. Present systems are unable to detect a jamming situation until a user pulls on the cable. Accordingly, technicians or other maintenance crew are required to perform routine checking of pull cable systems to ensure proper operation and to ensure that a previously undetected physical deformity in the cable pull system has not rendered the system inoperable.

Additionally, existing cable pull switches are binary in operation, both in their output signal and in their method of detection. Accordingly, existing cable pull switches lack a dynamic response to environmental and situational changes and are therefore limited in their flexibility and application.

BRIEF DESCRIPTION

In one embodiment, an apparatus comprising a cable pull switch is described. The cable pull switch including a substrate configured to couple to a first end of a pull cable and configured to experience a variable mechanical stress related to a tension exerted by the pull cable. The cable pull switch further includes an electrical strain gauge bonded to the substrate and configured to alter an electrical resistance through the strain gauge in proportion to the variable mechanical stress experienced by the substrate; and at least one processing device coupled to the strain gauge. The processing device configured to receive an indication of the value of the electrical resistance through the strain gauge; determine whether the value of the electrical resistance through the strain gauge exceeds an upper pull threshold value, the upper pull threshold value being indicative of a cable pull event; and generate an output signal indicative of the cable pull event in response to determining that the electrical resistance through the strain gauge exceeds the upper pull threshold value.

In another embodiment, a cable pull switch is described. The cable pull switch comprising a polychotomous cable pull sensor configured to provide a reading comprising at least one of a plurality of values, the reading corresponding to at least one of a tension on a pull cable or a linear displacement of a first end of a pull cable. The cable pull switch further comprising at least one processing device coupled to the cable pull sensor. The processing device configured to receive the reading the cable pull sensor; determine whether a value of the reading is outside of a non-tripped value window, a first limit edge of the non-tripped value window comprising a pull threshold value, the pull threshold value being indicative of a cable pull event; and generate an output signal indicative of the cable pull event in response to determining that the value of the reading is outside of the non-tripped value window on the first limit edge side.

In a further embodiment, an apparatus comprising a cable pull switch configured to be coupled to a first end of a pull cable is described. The cable pull switch comprising a linear optical sensor array configured to measure a linear displacement of the first end of a pull cable. The cable pull switch further comprises at least one processing device coupled to the linear optical sensor array. The processing device configured to receive from the linear optical sensor array a signal indicative of the value of displacement of the first end of the pull cable; determine whether the value of displacement is outside of a non-tripped value window on a first side of the non-tripped value window defined by a pull threshold value, the pull threshold value being indicative of a cable pull event; and generate an output signal indicative of the cable pull event in response to determining that the value of displacement is outside of the non-tripped value window on the first side.

In a further embodiment, a cable pull switch is described. The cable pull switch comprising a spring configured to couple to a first end of a pull cable and configured to at least one of linearly compress or linearly expand in relation to a linear displacement of the first end of the pull cable. The cable pull switch further comprising an electrical inductance sensor electrically coupled to the spring and configured to sense an electrical inductance value of the spring and to sense a change in the electrical inductance value of the spring in relationship to at least one of a linear compression or a linear expansion of the spring, and at least one processing device coupled to the electrical inductance sensor. The at least one processing device configured to receive from the electrical inductance sensor a signal indicative of the electrical inductance value of the spring; determine whether the electrical inductance value is outside of a non-tripped value window on a first side of the non-tripped value window defined by a pull threshold value, the pull threshold value being indicative of a cable pull event; and generate an output signal indicative of the cable pull event in response to determining that the electrical inductance value is outside of the non-tripped value window on the first side.

In another embodiment, a cable pull switch is described. The cable pull switch comprises a polychotomous cable pull sensor configured to provide a reading comprising at least one of a plurality of values, the reading corresponding to at least one of a tension on a pull cable or a linear displacement of a first end of a pull cable, and at least one processor coupled to the polychotomous cable pull sensor. The processor configured to determine a rate of change of the value of the reading from the sensor, and determine an occurrence of a cable pull event, the determination based at least in part on the determined rate of change of the value.

In another embodiment, a cable pull switch is described. The cable pull switch comprising an illuminator configured to output a visual indication corresponding to a requirement to at least one of increase or decrease the tension exerted by a pull cable coupled to the cable pull switch while in a pull cable tension adjustment state.

In another embodiment, a system is described. The system comprising a cable pull switch configured to couple to a first end of a pull cable. The system further comprising a pull cable excitation module configured to couple to a second end of the pull cable; enter a pull cable excitation state by varying a tension exerted on the second end of the pull cable; and communicate with the cable pull switch to initiate the pull cable excitation state. Wherein the cable pull switch is further configured to detect at the first end of the pull cable the carrying tension exerted on the second end of the pull cable during the pull cable excitation state; and generate an output signal indicative of a pull cable failure in response to failing to detect the varying tension during the pull cable excitation state.

In a further embodiment, a cable pull switch is described. The cable pull switch comprising a polychotomous cable pull sensor configured to provide a reading comprising at least one of a plurality of values, the reading corresponding to at least one of a tension on a pull cable or a linear displacement of a first end of a pull cable. The cable pull switch further comprising at least one processor coupled to the polychotomous cable pull sensor. The processor configured to continuously monitor the reading; determine a rate of change of the value of the reading from the sensor; periodically adjust an upper pull threshold value at a fixed interval of time if the rate of change of the value of the reading from the sensor is below a rate of change threshold; periodically adjust a lower slack threshold value at the fixed interval of time if the rate of change of the value of the reading from the sensor is below a rate of change threshold; and determine an occurrence of a cable pull event, the determination based at least in part on the determined rate of change of the value.

In one embodiment, an apparatus for an imbalance test includes a strain measurement module that measures a strain voltage across terminals of a strain gauge. The strain voltage is representative of an amount of force on the strain gauge. The apparatus includes a test measurement module that measures a test voltage across the terminals of the strain gauge while a test resistor is connected in parallel with a resistor of the strain gauge. The test resistor is connected while the test measurement module measures the test voltage and is disconnected while the strain module measures strain voltage. The apparatus includes an average module that calculates an average strain voltage from two strain voltage measurements. The strain voltages are measured preceding and after the test voltage measurement. The apparatus includes a difference module that determines a difference voltage. The difference voltage is a difference between the average strain voltage and the test voltage. The modules include hardware circuits, a programmable hardware device and/or executable code, where the executable code is stored on one or more computer readable storage media.

In one embodiment, the test measurement module and the strain measurement module alternate measurements of voltage across terminals of the strain gauge for a plurality of measurements and, for each test measurement, the average module calculates an average strain voltage from two strain voltage measurements measured preceding and after a particular test voltage measurement. In the embodiment, the difference module determines a difference voltage corresponding to each test voltage. Each difference voltage is a difference between the average strain voltage of the strain voltage measured before the particular test measurement and the strain voltage measured after the particular test measurement. In another embodiment, the apparatus includes a difference average module that determines an average difference voltage from a plurality of difference voltages measured by the difference module, and a strain average module that determines an average strain voltage from a plurality of strain voltages measured by the strain measurement module, where the average strain voltage is transmitted to a strain monitoring device. In a further embodiment, the apparatus includes a difference limit module that compares the average difference voltage and a difference threshold, and a difference alert module that sends an alert if a magnitude of the average difference voltage is greater than the difference threshold.

In one embodiment, for each strain voltage measurement, the strain measurement module measures voltage of the strain gauge a plurality of times and averages the plurality voltages to determine the strain voltage and, for each test voltage measurement, the test measurement module measures voltage of the strain gauge a plurality of voltages and averages the plurality voltages to determine the test voltage. In a further embodiment, the plurality of voltages measured by the strain measurement module are three voltages and the plurality of voltages measured by the test measurement module are three voltage measurements. In another embodiment, the test measurement module and the strain measurement module alternate measurements of voltage of the strain gauge at a measurement sample rate and a rate of measurement of voltages by the strain measurement module for each strain voltage and by the test measurement module for each test voltage is much less than the measurement sample rate.

In some embodiments, the test measurement module and the strain measurement module alternate measurements of voltage of the strain gauge at a measurement sample rate during an imbalance test. The imbalance test results in a plurality of test voltage measurements and strain voltage measurements of a cycle of a fundamental frequency of power provided to the apparatus that includes the strain gauge. In another embodiment, a length of time of the imbalance test is within 10 percent of a cycle of the fundamental frequency.

In one embodiment, the apparatus includes a test activation module that connects the test resistor after the strain measurement module measures strain voltage and prior to the test measurement module measuring a test voltage, and a test deactivation module that disconnects the test resistor from the resistor of the strain gauge after the test measurement module measures the test voltage and prior to the strain measurement module measuring a next strain voltage. In a further embodiment, the test activation module connects and the test deactivation module disconnects a first test resistor in parallel with a first resistor of the strain gauge during a first imbalance test and connects and disconnects a second test resistor in parallel with a second resistor of the strain gauge during a second imbalance test. Each of the first imbalance test and the second imbalance test include a plurality of test voltage measurements and strain voltage measurements. In another embodiment, the strain gauge measures force of a cable pull switch.

A method for an imbalance test, in one embodiment, includes measuring a strain voltage across terminals of a strain gauge, where the strain voltage is representative of an amount of force on the strain gauge. The method includes measuring a test voltage across the terminals of the strain gauge while a test resistor is connected in parallel with a resistor of the strain gauge. The test resistor is connected while measuring the test voltage and disconnected while measuring the strain voltage. The method includes calculating an average strain voltage from two strain voltage measurements. The strain voltages are measured preceding and after the test voltage measurement. The method includes determining a difference voltage. The difference voltage is a difference between the average strain voltage and the test voltage.

In one embodiment, the method alternating measurements of test voltage and strain voltage for a plurality of measurements and calculating an average strain voltage includes, for each test measurement, calculating an average strain voltage from two strain voltage measurements measured preceding and after a particular test voltage measurement. Determining a difference voltage includes determining a difference voltage corresponding to each test voltage, where each difference voltage is a difference between the average strain voltage of the strain voltage measured before the particular test measurement and the strain voltage measured after the particular test measurement.

In a further embodiment, the method includes determining an average difference voltage from a plurality of difference voltages. In another embodiment, the method includes comparing the average difference voltage and a difference threshold, and sending an alert if a magnitude of the average difference voltage is greater than the difference threshold. In another embodiment, for each strain voltage measurement, the method includes measuring voltage of the strain gauge a plurality of times and averaging the plurality voltages to determine the strain voltage, and, for each test voltage measurement, the method includes measuring voltage of the strain gauge a plurality of voltages and averaging the plurality voltages to determine the test voltage. In another embodiment, the method includes connecting the test resistor after measuring strain voltage and prior to measuring a test voltage, and disconnecting the test resistor from the resistor of the strain gauge after measuring the test voltage and prior to measuring a next strain voltage.

In one embodiment, a cable pull switch system includes a strain gauge in mechanical communication with a cable. The strain gauge measures force on the cable. The system includes a strain measurement module that measures strain voltage across terminals of the strain gauge. The strain voltage is representative of an amount of force on the strain gauge. The system includes a test measurement module that measures a test voltage across the terminals of the strain gauge while a test resistor is connected in parallel with a resistor of the strain gauge. The test resistor is connected while the test measurement module measures the test voltage and is disconnected while the strain module measures strain voltage. The system includes an average module that calculates an average strain voltage from two strain voltage measurements. The strain voltages are measured preceding and after the test voltage measurement. The system includes a difference module that determines a difference voltage. The difference voltage is a difference between the average strain voltage and the test voltage.

In one embodiment, the test measurement module and the strain measurement module alternate measurements of voltage across terminals of the strain gauge for a plurality of measurements and, for each test measurement, the average module calculates an average strain voltage from two strain voltage measurements measured preceding and after a particular test voltage measurement and the difference module determines a difference voltage corresponding to each test voltage. Each difference voltage is a difference between the average strain voltage of the strain voltage measured before the particular test measurement and the strain voltage measured after the particular test measurement. In the embodiment, the system includes a difference average module that determines an average difference voltage from a plurality of difference voltages measured by the difference module, a difference limit module that compares the average difference voltage and a difference threshold, a difference alert module that sends an alert if a magnitude of the average difference voltage is greater than the difference threshold, and a strain average module that determines an average strain voltage from a plurality of strain voltages measured by the strain measurement module. The average strain voltage is transmitted to a strain monitoring device.

These and other benefits may become clearer upon making a thorough review and study of the following detailed description. Further, while the embodiments discussed above a listed as individual embodiment, it is to be understood that the above embodiments, including all elements contained therein, can be combined in whole or in part.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 12 shows an example state table of operational states of the cable pull switch of FIG. 2 in accordance with various embodiments;

Figure 1:
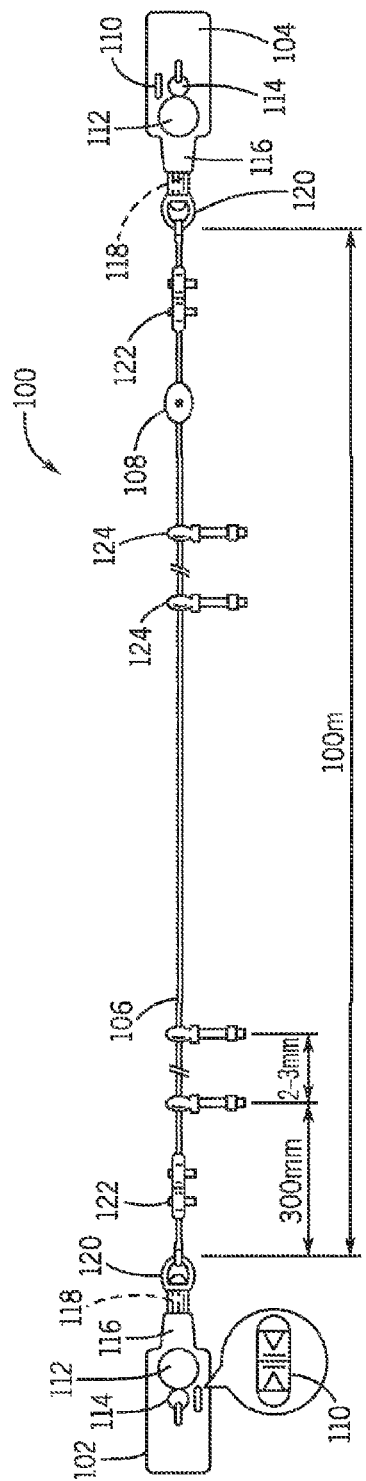
FIG. 1 is an illustration of an example contextual implementation of a cable pull system in accordance with various embodiments.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components or integrated circuits (e.g., an Application Specific Integrated Circuit (ASIC)). A module may also be implemented in programmable hardware devices or a programmable logic device ("PLD"), such as a field programmable gate array ("FPGA"), programmable array logic, programmable logic devices or the like.

Hardware circuits (including programmable logic for use with a programmable logic device) implementing all or part of the functionality previously described herein may be designed using traditional manual methods, or may be designed, captured, simulated, or documented electronically using various tools, such as Computer Aided Design ("CAD"), a hardware description language (e.g., VHSIC Hardware Description Language ("VHDL" where VHSIC is Very High Speed Integrated Circuit) or Altera Hardware Description Language ("AHDL")), or a PLD programming language (e.g., PALASM, Advanced Boolean Expression Language ("ABEL"), or CUPL).

Modules may also be implemented in software for execution by various types of processors (e.g., a microprocessor, micro controller, digital signal processor, server computer, or general purpose computer). An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory ("RAM"), a read-only memory ("ROM"), an erasable programmable read-only memory ("EPROM" or Flash memory), a PC card (e.g. PMCIA card), a portable compact disc read-only memory ("CD-ROM"), a digital versatile disc ("DVD"), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). The computer program product may be shared, simultaneously serving multiple customers in a flexible, automated fashion.

The computer program product may be integrated into a client, server and network environment by providing for the computer program product to coexist with applications, operating systems and network operating systems software and then installing the computer program product on the clients and servers in the environment where the computer program product will function. In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure may refer to elements of proceeding figures. Like numbers refer to like elements in all figures, including alternate embodiments of like elements.

Referring now to the figures, FIG. 1 illustrates an example contextual implementation of a cable pull system 100 in accordance with various embodiments. The cable pull system 100 includes a first cable pull switch 102, an optional second cable pull switch 104, a pull cable 106 extending between the switches, and an optional tensioner 108 installed along the pull cable 106.

In prior art application settings, the cable pull switches 102, 104 may be of any suitable contact-based design, for example, as is described in U.S. Pat. No. 6,365,850 to Arnold et al., the contents of which are incorporated by reference. The cable pull switches 102 and 104 may each comprise a tension indicator 110, an emergency stop button 112, and a reset button 114. Each cable pull switch 102, 104 may also comprise a tubular body extension 116 which receives a spring-loaded shaft 118 (shown in phantom) attached to a rotatable D-ring connector 120. The switches are mounted such that the distance between the D-ring connector 120 is generally less than 100 meters, though other distances may be suitable in various application settings.

In various embodiments, the pull cable 106 can be a PVC coated steel cable, although any suitable cable may be used. The pull cable 106 may be attached between the cable pull switches 102, 104 by passing the cable around suitable thimbles looped through the D-ring connector 120 and clamping the cable ends in clamps 122, in a known manner. The pull cable 106 is typically supported along its length by means of a plurality of eye bolts 124 placed at distances of 2 to 3 meters apart along the machinery.

Figure 2:
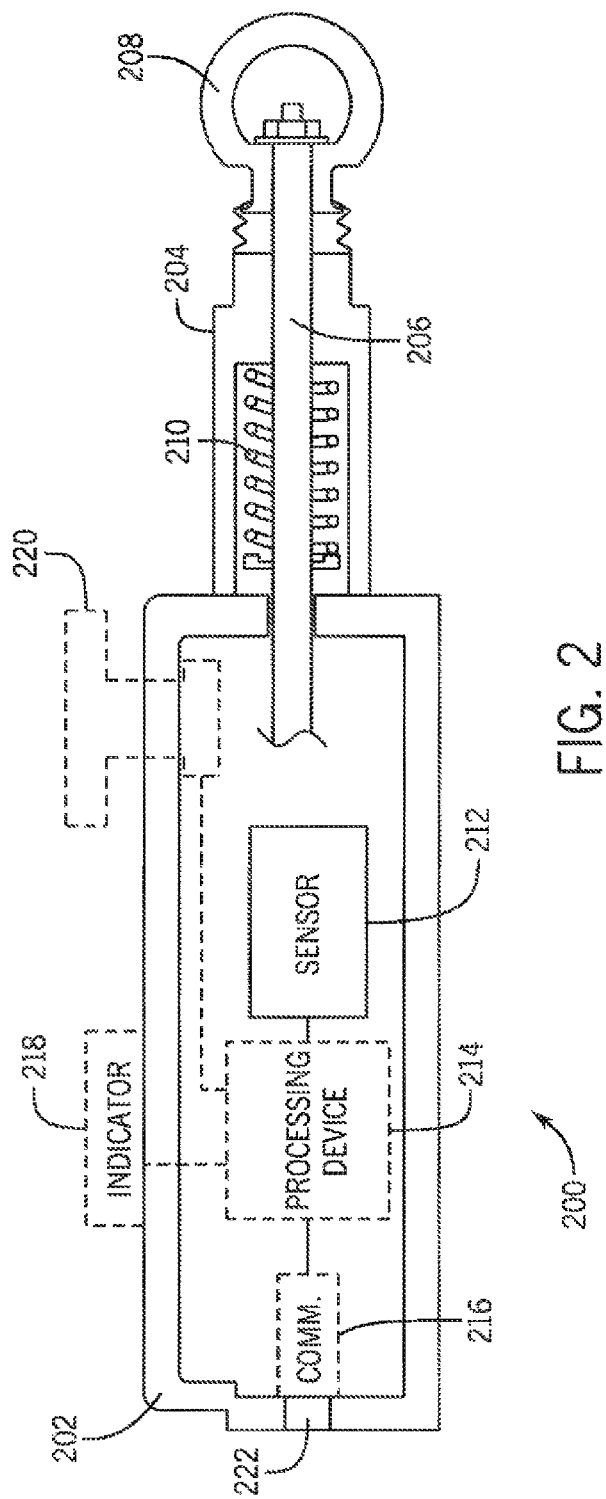
FIG. 2 shows a cable pull switch in accordance with various embodiments.

Turning now to FIG. 2, an improved cable pull switch 200 is illustrated in accordance with various embodiments. Like the cable pull switch 102 of FIG. 1, the cable pull switch 200 includes a body 202 and may include a tubular body extension 204 (similar to or the same as tubular body extension 116 discussed above) through which a shaft 206 passes, however, the tubular body extension 204 is not required in all embodiments. A rotatable D-ring connector 208 can also be included at a distal end of the shaft 206 to allow a pull cable 106 to be connected thereto. In various embodiments, a spring 210 is included within the tubular body extension 204 or within the body 202 and is configured to exert a rearward force on the shaft 206 toward the body 202. The spring 210 may be a compression spring that is compressed when the shaft 206 is displaced in a direction away from the body 202, for example, as is shown in FIG. 2. Such displacement may occur during a cable pull event. In other embodiments, the spring 210 may be an extension spring and may be configured to extend when the shaft 206 is displaced in a direction away from the body 202. Other spring types and configurations may be possible.

The cable pull switch 200 can include a sensor 212, and in some embodiments, can also include a processing device 214, a communication module 216, an indicator 218, and/or an emergency stop ("e-stop") actuator 220. In various embodiments, the sensor 212 is a polychotomous sensor, in that the sensor 212 provides a variable output reading that is not limited to a binary on/off or open/closed state (e.g., unlike a contact switch, which can only provide an open or closed output). The output of the polychotomous sensor 212 may be digital or analog, and may include a plurality of possible values (possible near infinite output values if analog). The polychotomous sensor 212 may output one of the plurality of possible values dependent upon the sensed condition, which output value may be always available (e.g., when operating), continuously updated, or only available or updated upon request (e.g., a request from processing device 214 or another processing device). In various embodiments, the sensor 212 is an electrical sensor and may include various circuitry elements and modules to affect its particular sensing mechanism. Examples of polychotomous sensors 212 include, but are not limited to, strain gauges, linear optical sensor arrays, or inductance sensors, all of which are discussed in greater detail below. Still further examples may include Hall effect sensors, proximity sensors, potentiometric position sensors, capacitive position sensors, linear voltage differential transformers, magnetostrictive linear position sensors, eddy current-based position sensors, fiber-optic position sensors, rotary encoders, incremental encoders, wire draw encoders, gravimeter sensors, gyroscopic sensors, impact sensors, inclinometers, laser rangefinder sensors, selsyn sensors, shock detectors, tilt sensors, ultrasonic thickness gauges, variable reluctance sensors, bhangmeter sensors, hydrometer sensors, force sensors, level sensors, load cells, magnetic level gauges, nuclear density gauges, piezoelectric sensors, torque sensors, viscometer sensors, and other known and unknown sensing devices that are capable of outputting a plurality of sensor values corresponding to a measurement of a strain, a stress, a tension, a location, a velocity, an acceleration, a change in a condition, or other measurable conditions. The polychotomous sensor 212 may be configured to output an absolute value (e.g., an actual position of one element compared to another, or a measured value of a strain exerted on an object, etc.) or an incremental value (e.g., a position relative to an end stop position or relative to a position at startup, etc.).

The processing device 214 may communicate with the sensor 212 and/or the communication module 216 via any known communication protocol. Alternatively, either or both of the sensor 212 and the communication module 216 may be integral with the processing device 214. The processing device 214 may comprise one or more microprocessors, microcontrollers, Field-Programmable Gate Arrays (FPGA), Application-Specific Integrated Circuits (ASIC), Digital Signal Processors (DSP), Peripheral Interface Controllers (PIC) processors, or other known processing device types or combinations thereof. The processing device 214 may, in certain embodiments, include or be coupled to memory devices as are known in the art. The processing device 214 may be configured to execute code (e.g., firmware or software) that may be stored therein or stored on a separate communicatively coupled memory device. The code may be loaded for the processing device 214 to execute through the communication module 216 (e.g., at manufacture time or during an upgrade), or may be pre-loaded during manufacture and/or assembly through another process. The communication module 216 (whether a separate module or integral with the processing device 214) is configured to output one or more signals (e.g., an Output Signal Switching Device signal ("OSSD")) through a communication port 222. The output signal may be coupled to one or more communication relays or other devices to effect control of an associated machine, particularly to shut the machine off or enter a safe mode in the event that the output signal indicates a trigger condition has occurred (e.g., a cable pull event). The communication module 216 may also receive inbound communications from other sources (e.g., from a network of devices or from the associated machine). Alternatively, in the absence of a processing device 214, the cable pull switch 200 may provide the sensor values from the sensor 212 to the output communication port 222 in a known manner so that a separate communicatively linked device can receive the sensor values and make decisions based thereon. In such an approach, the communication module 216 or a different processing device may be included, for example, a less powerful microprocessor, to effect communication through the communication port 222 of the sensor values.

In some embodiments, the cable pull switch 200 includes the e-stop actuator 220, which may be, for example, a highly-visible button located on an accessible surface (e.g., top surface) of the body 202 such that the actuator 220 can be easily depressed. The e-stop actuator 220 may utilize the same technologies described herein (for sensing a cable pull event through the shaft 206) to sense an actuation or depression of the actuator 220, or the actuator 220 may use different technology (e.g., more primitive contact-based switching) to sense actuation. In some embodiments, the e-stop actuator 220 is communicatively coupled to the processing device 214 and, upon actuation, will affect an output signal through the communication port 222 indicative of its actuation to affect stoppage of the associated machinery or to serve another function. The output function of the e-stop actuator 220 may serve the same function as that of the cable pull sensing function (e.g., to stop an associated machine), or may be a different function altogether (e.g., to stop a different machine).

Figure 3:
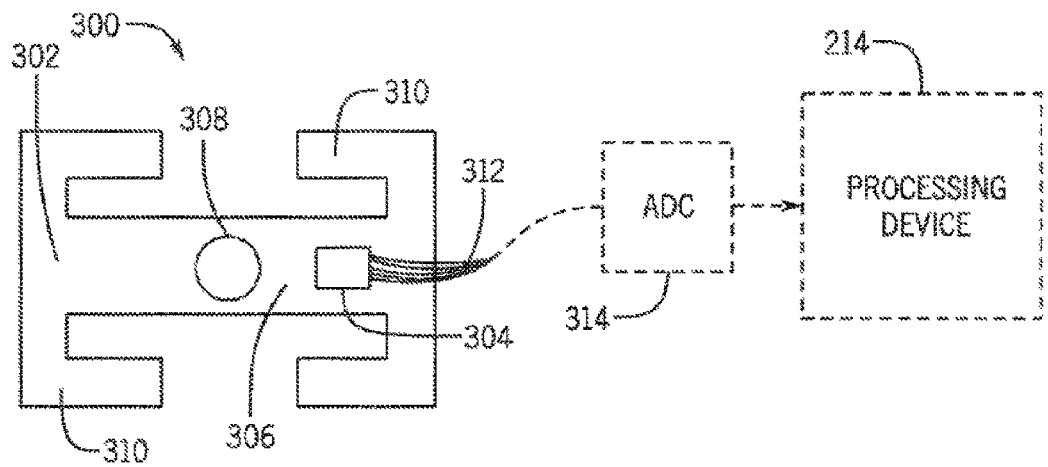
FIG. 3 shows an example strain gauge assembly as an example of a polychotomous sensor in accordance with various embodiments.
Figure 4A:
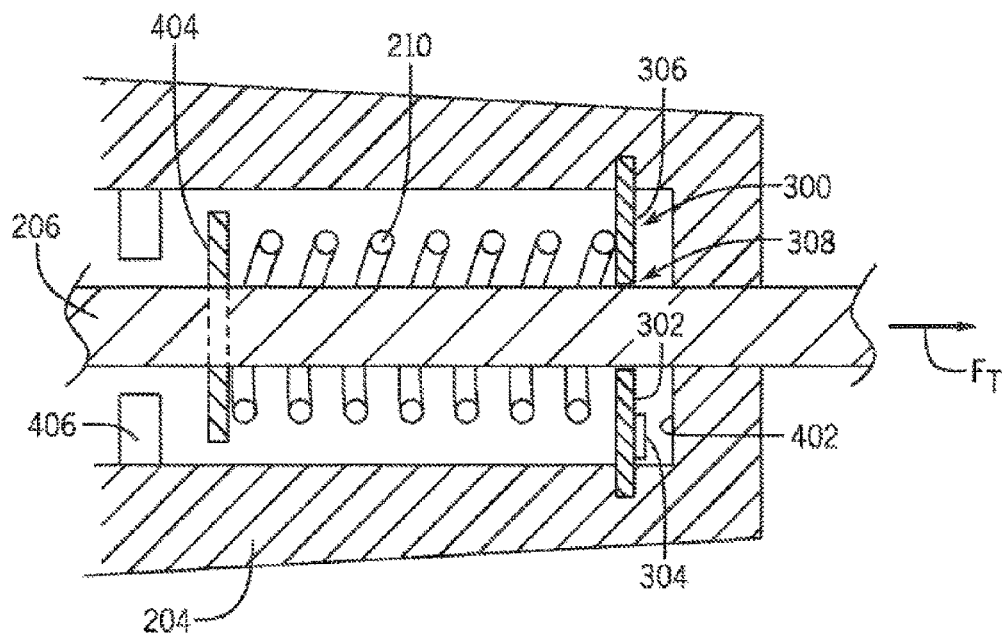
FIGS. 4A and 4B show example implementations of a polychotomous sensor usable with the cable pull switch of FIG. 2 in accordance with various embodiments.

Turning now to FIGS. 3 and 4A, an example implementation of a polychotomous sensor 212 within the cable pull switch 200 is illustrated in accordance with various embodiments. In this approach, a strain gauge assembly 300 includes a substrate 302 and a strain gauge 304 bonded to a surface of the substrate 302. The substrate 302 may be formed of metal (e.g., steel), though other rigid materials may be utilized. The substrate 302 may include a member 306 configured to receive stresses. The member 306 may also include one or more holes 308 and/or one or more tabs 310 to allow attachment to other elements. The strain gauge 304 may be a known type of strain gauge (e.g., using a metallic foil pattern, a semiconductor strain gauge, or other known and currently unknown strain gauge types) which may utilize a traditional Wheatstone bridge (or other known or currently unknown circuit designs) to implement an output reading. The strain gauge 304 may be bonded to a surface of the substrate 302 through any known mechanical bonding technique, including but not limited to adhesives (e.g., epoxy) or thermal bonding. Many variations are possible as to the design and implementation of the strain gauge 304 and the substrate 302 and may be application specific.

The strain gauge 304 may include electrical wiring 312 to output a sensed value. For example, the strain gauge 304 may output or make available a value of an electrical resistance through the strain gauge 304. This value can be coupled, via the electrical wiring 312, to an analog-to-digital converter ("ADC") 314 which may be separate from or integral with the processing device 214. The ADC 314 may convert a reading of the electrical resistance through the strain gauge 304 into a digital value for use by the processing device 214 or another device. For example, the ADC 314 (or another device) may effect a voltage or current to flow through the strain gauge 304 and a value of the electrical resistance can be determined by reading a corresponding current or voltage output (e.g., according to the equation V=I*R or another variation, where V is the voltage, I is the current, and R is the resistance). Alternatively, the strain gauge 304 itself may be configured to output a digital value of the electrical resistance by an incorporated ADC within the strain gauge 304.

As a force or stress (e.g., a bending stress) is exerted upon the member 306 of the substrate 302, the member 306 will flex slightly in proportion to the amount of stress exerted. In accordance with various embodiments, this slight flexing causes a corresponding and proportional flexing in traces of a resistive circuit within the strain gauge 304, which in turn alters a value of the electrical resistance there through. The value of this electrical resistance is therefore related to and proportionate to the amount of stress exerted upon the member 306 of the substrate 302.

Figure 4B:
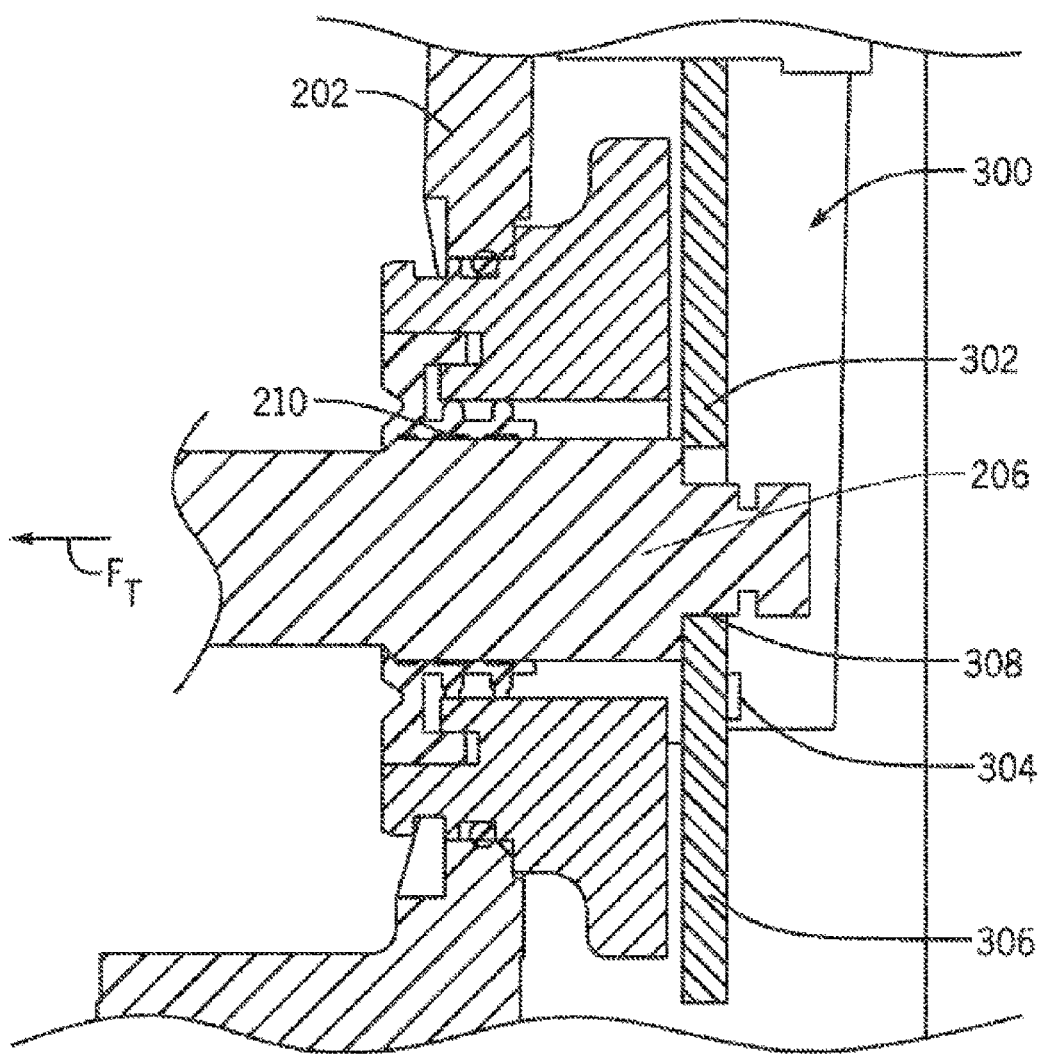

Turning now to FIG. 4A, an example implementation of the strain gauge assembly 300 with the cable pull switch 200 is illustrated in accordance with various embodiments. In one approach, the strain gauge assembly 300 can be located within the tubular body extension 204 (e.g., with notches or ridges formed therein, or the like) such that the shaft 206 passes through the hole 308 of the substrate 302. Other arrangements and/or configurations are possible, such as where the tubular body extension 204 is eliminated or reduced in size such that the spring 210 is at least partially external to the body 202 (see FIG. 4B). In this arrangement, the spring 210 can be at least partially or completely free of mechanical interference with the tubular body extension 204. The member 306 of the substrate 302 is free from mechanical interference from adjacent side walls (e.g., the front wall surface 402) such that it is allowed to flex. Wiring 312 (not shown in FIGS. 4A and 4B) can be routed from the strain gauge 304 to a processing device 214 or other element. A stop element 404 (e.g., a ring or pin) can be secured to or integrally formed with the shaft 206. In one embodiment, the stop element 404 (or another feature of the shaft 206) may engage a rear backstop 406 in the absence of a tension force ($F_T$) that exceeds the force exerted by the spring 210. By this, the rear backstop 406 dictates a fully contracted resting position of the shaft 206. Other positions and/or configurations are possible for the rear backstop 406.

The spring 210 (here, a compression spring) is compressed between the stop element 404 and the member 306 of the substrate 302 of the strain gauge assembly 300. In this manner, a tension force ($F_T$) exerted on the shaft 206 in the longitudinal direction (indicated by the arrow $F_T$) by tension from the pull cable 106 will compress the spring 210, thereby exerting a stress on the substrate 302. As the shaft moves further outward (e.g., by a cable pull event or by increased tension adjustment of the pull cable 106), the spring 210 is compressed further, which increases the force exerted by the spring 210 on the substrate 302 resulting in increased stress exerted on the substrate 302. This stress exerted on the substrate 302 by spring 210 is directly related to the displacement of the shaft 206 (i.e., in a non-moving state) by Hooke's Law (F=−k*X, where F is the force exerted by the spring 210, k is the spring constant of the spring 210, and X is the displacement (e.g., compression) of the spring 210 from its non-compressed resting position). By measuring the stress in the substrate 302 with the strain gauge 304, and with the knowledge of other variables (e.g., the designed spring constant k of the spring 210), the displacement distance of the shaft 206 can be determined. This calculated displacement distance, or, alternatively, the measured stress value itself, can be used to detect a cable pull event, a cable slack event, or to determine a proper adjustment tension (e.g., during installation and/or maintenance adjustment).

Other variations are possible for the placement of the strain gauge assembly 300 and/or its interaction with spring 210 or a different spring (e.g., an extension spring or a spring purposed solely for sensing purposes) or with the shaft 206 itself. For example, the strain gauge assembly 300 and/or the spring 210 (or a different spring) may be placed within the housing body 202 rather than within the tubular body extension 204. Further, many variations on the design of the substrate 302 and its interaction with the spring 210 and/or shaft 206 may be possible and are contemplated by this disclosure.

Figure 5:
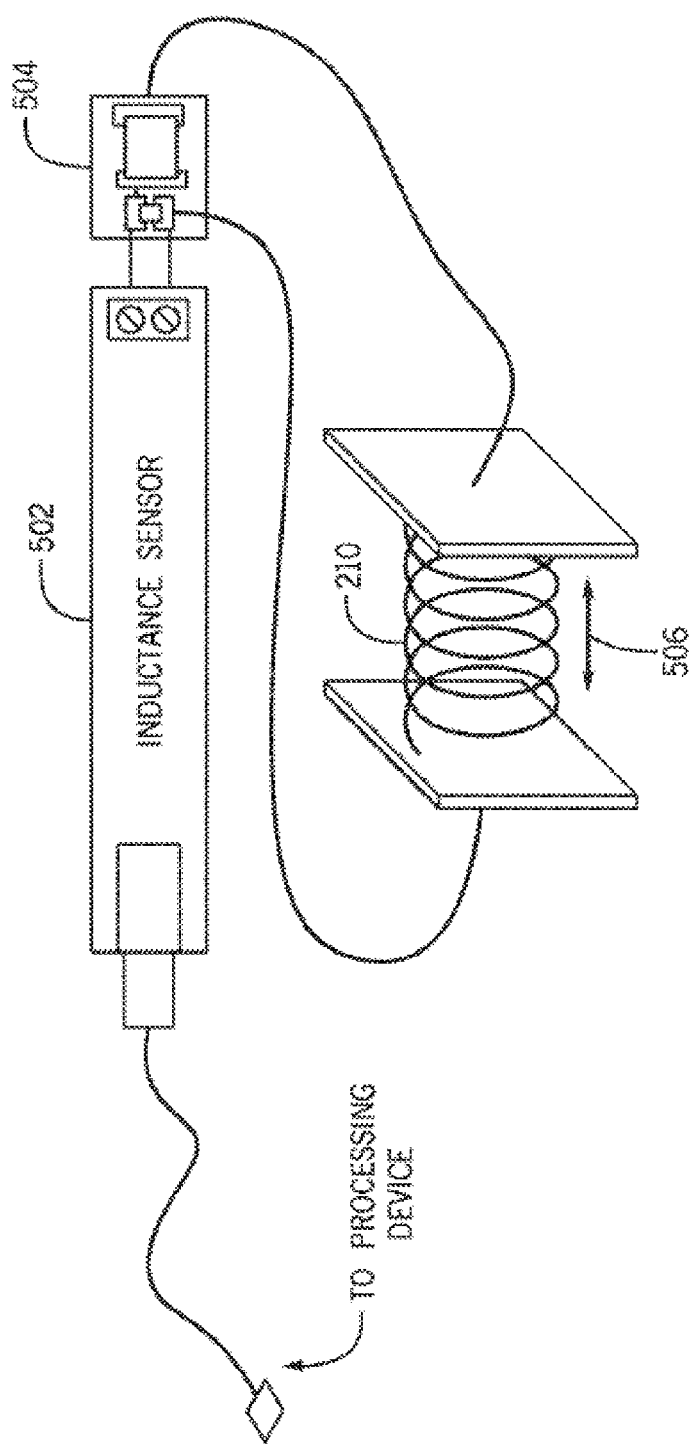
FIG. 5 shows an example inductance sensor as an example of a polychotomous sensor in accordance with various embodiments.

Turning now to FIG. 5, a different implementation of a polychotomous sensor 212 is illustrated in accordance with various embodiments. FIG. 5 illustrates a conceptual implementation of an inductance sensor 502 in accordance with various embodiments. The inductance sensor 502 is connected to the spring 210 (or another spring), possibly through various interceding and/or conditioning circuitry elements 504 as may be appropriate in a given application setting. For example, two leads are provided from the inductance sensor 502 and/or circuitry elements 504, one lead is electrically connected to a first end of the spring 210 (e.g., a coil spring), and the second lead is electrically connected to a second end of the spring 210. The inductance sensor 502 can then measure an inductance of the spring 210. As the spring is compressed or expanded (shown by arrow 506), the inductance of the spring 210 can change, and the inductance sensor 502 can sense and measure those changes. One example of an inductance sensor 502 may include a LDC1000 manufactured by Texas Instruments® of Dallas, Tex.

The electrical inductance of the spring 210 may be proportional to the compression distance of the spring 210, which compression distance is directly proportional to the displacement distance of the shaft 206. As such, the inductance sensor 502 can measure the electrical inductance within the spring 210 and a processing device 214 (or another device) can convert that electrical inductance value into a displacement distance and/or a tension force value.

Figure 6:
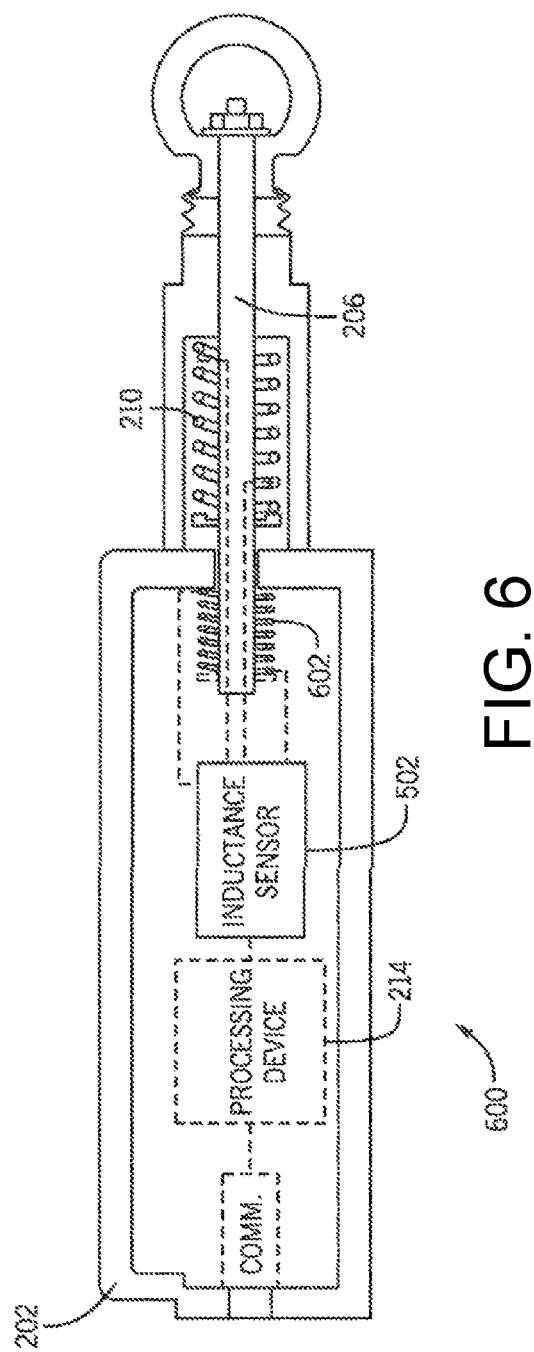
FIG. 6 shows another example implementation of a polychotomous sensor usable with the cable pull switch of FIG. 2 in accordance with various embodiments.

Turning to FIG. 6, an example cable pull switch 600 incorporating the inductive sensor 502 is illustrated in accordance with various embodiments. The inductance sensor 502 may be electrically coupled to the ends of the spring 210 through leads (shown in dashed line passing through the shaft 206, however their actual routes through the assembly may be different). In this approach, the inductance sensor 502 can measure the inductance through the spring 210 operating as a main tensioning spring. Alternatively, and in accordance with a different embodiment, a second spring 602 different from the spring 210 could be provided elsewhere (e.g., within the main body 202) such that the second spring 602 is compressed and/or expanded in relation to the displacement of the shaft 206. Each end of the second spring 602 could be connected to the inductive sensor 502 and the value of the electrical inductance through the second spring 602 could be used to determine a shaft displacement distance and/or tension.

Accordingly, the processing device 214 can monitor the present displacement distance of the shaft 206 and any changes in that displacement distance via the inductance sensor 502 in order to detect a cable pull event, a cable slack event, or to aid in tensioning adjustments. Similarly, an inductance sensor 502 could be utilized with the e-stop actuator 220 to detect a depressed distance of the actuator 220 to detect its actuation.

Figure 7:
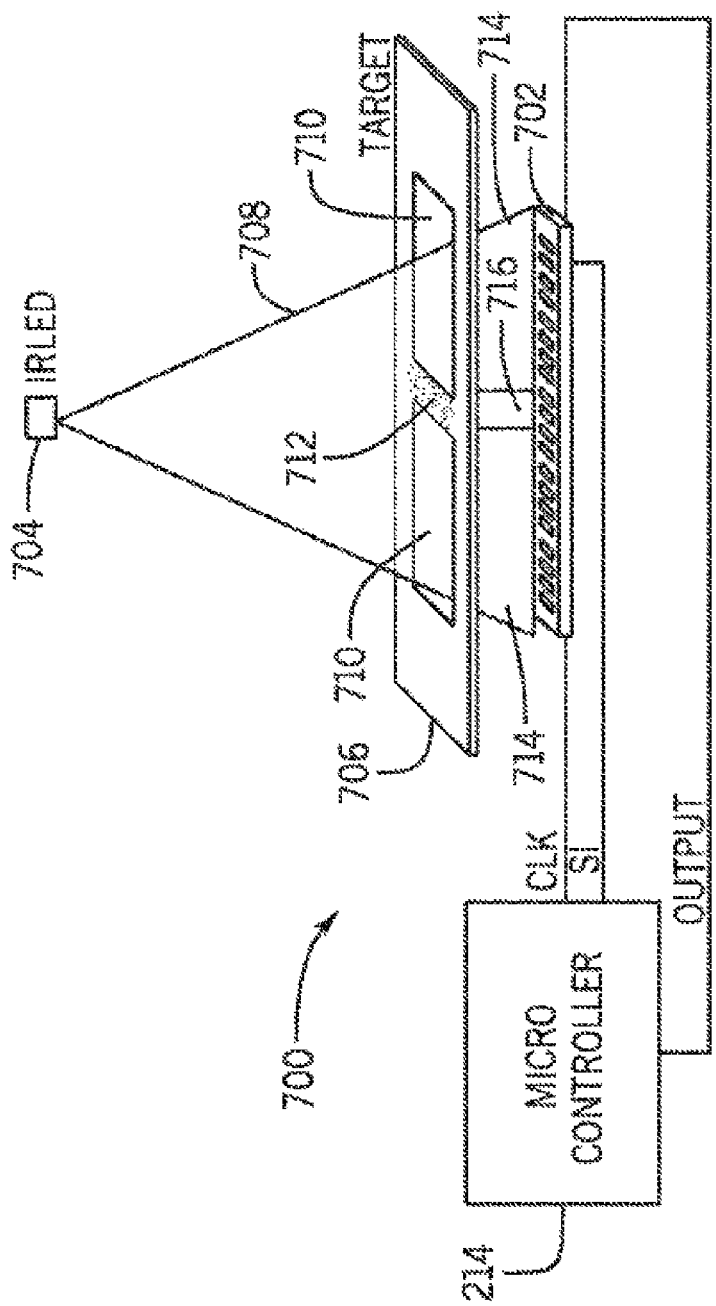
FIG. 7 shows an example linear optical sensor assembly as an example of a polychotomous sensor in accordance with various embodiments.

Turning now to FIG. 7, a different implementation of a polychotomous sensor 212 is illustrated in accordance with various embodiments. FIG. 7 illustrates a conceptual implementation of linear optical sensor assembly 700 in accordance with various embodiments. The linear optical sensor assembly 700 includes a linear optical sensor array 702, an illuminator (e.g., an infra-red light emitting diode ("IR LED") 704, and a movable target 706. The linear optical sensor array 702 (and the IR LED 704) can be electrically coupled to the processing device 214 to control operations thereof and to receive optical position readings therefrom. In various approaches, a clock signal ("CLK") and a serial input signal (SI) (to initiate data readout) may be provided from the processing device 214 to the linear optical sensor array 702 and an analog or digital output signal from the linear optical sensor array 702 may be coupled back to the processing device 214 or to an interceding ADC, if required (not shown). In operation, and in accordance with various embodiments, the IR LED 704 provides light 708 to illuminate a sensor surface the linear optical sensor array 702 including a plurality of individual photodiode sensors. The target 706 may include one or more apertures 710 and/or light blocking elements 712. Light passes through the apertures 710 and onto illuminated portions 714 of the sensor surface of the linear optical sensor array 702, while other shaded portions 716 of the sensor surface are shaded from the light 708 by the light blocking elements 712. In this manner, a location of the target 706 relative to the linear optical sensor array 702 can be determined based on the encoded pattern of light 714 and shade 716 sensed by the individual photodiodes of the linear optical sensor array 702.

Other variations are possible for the optical sensor assembly 700. For example, instead of apertures 710 and light blocking elements 712, reflective and non-reflective surfaces can be used. Many other known configurations are possible and are contemplated by this disclosure. Additionally, the target 706 can include an encoded pattern that is absolute or incremental, though an absolute position encoded pattern may be beneficial in many application settings (e.g., to reduce the need for or eliminate a calibration step upon power up).

Figure 8:
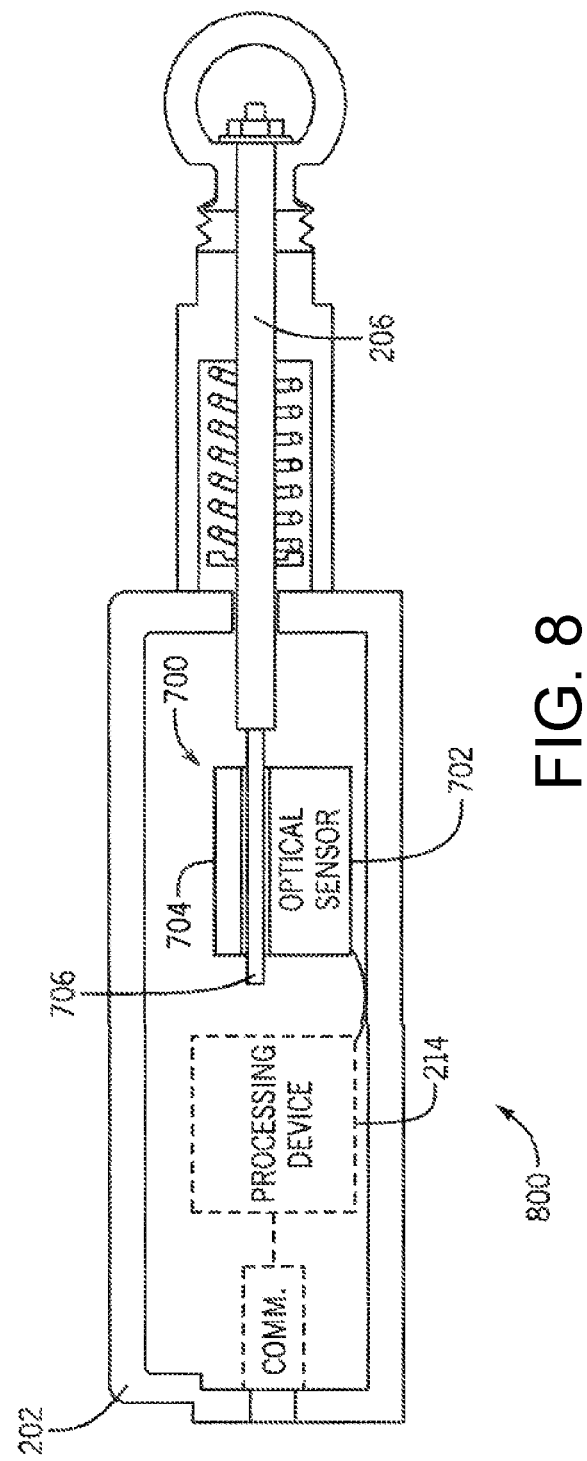
FIG. 8 shows another example implementation of a polychotomous sensor usable with the cable pull switch of FIG. 2 in accordance with various embodiments.

Turning to FIG. 8, an example cable pull switch 800 incorporating the linear optical sensor assembly 700 is illustrated in accordance with various embodiments. The linear optical sensor assembly 700 may be included within the body 202 of the cable pull switch 800. The target 706 may be coupled directly (as shown) or indirectly to the shaft 206 such that linear movement of the shaft 206 corresponds to linear movement of the target 706. The light pattern created by the target 706 and illuminated onto the sensor surface of the linear optical sensor array 702 provides information as to the present displacement distance of the shaft 206. The linear optical sensor array 702 can in turn provide the sensed optical position data to the processing device 214, which can in turn determine the present displacement distance of the shaft 206. As the target 706 moves in connection with movement of the shaft 206, the light pattern illuminated on the sensor surface of the linear optical sensor array 702 will change and the corresponding optical position data will change.

Accordingly, the processing device 214 can monitor the present displacement distance of the shaft 206 and any changes in that displacement distance via the linear optical sensor assembly 700 in order to detect a cable pull event, a cable slack event, or to aid in tensioning adjustments. Similarly, a linear optical sensor assembly 700 could be utilized with the e-stop actuator 220 to detect a depressed distance of the actuator 220 to detect its actuation.

In various ones of the above embodiments (e.g., the strain gauge embodiment, the inductance sensor embodiment, and/or the optical light sensor array embodiment) or other possible embodiments, the particular sensor 212 type used may be an absolute sensor or an incremental sensor. In either approach, it may be beneficial to calibrate the readings from the sensor 212. For example, springs 210 and or sensors 212 may have tolerances in their initial manufacturing such that calibration could help ensure proper correlation of values to positions and/or tension amounts. If a strain gauge assembly 300 is used, an initial strain value reading could be taken during assembly of the strain exerted on the substrate 302 by the spring 210 when the shaft 206 is in its fully contracted resting position. Optionally, a second strain value reading could be taken at a known and controlled displacement distance, while additional different readings could be taken in a similar manner as well. A correlation could be made between the recorded strain value(s) and the displacement distance(s) (e.g., zero and/or another known displacement distance) to calibrate the cable pull switch 200. The calibration reading(s) could also be made periodically or with every power-up to account for any deterioration or change in the strength of the spring 210 and/or the substrate 302 (e.g., due to use over time and/or due to thermal changes) or other factors.

Similarly, if an inductance sensor 502 is used, an initial inductance value reading could be taken when assembled or when installed at one or more known displacement positions to calibrate the cable pull switch 200. Again, these calibration readings could be repeated periodically as well.

If a linear optical sensor assembly 700 is used, initial optical position value readings could be taken when assembled or when installed at one or more known displacement positions to calibrate the cable pull switch 200. However, the variations of a linear optical sensor array 702 and/or a moving target within the cable pull switch 200 may be much more controllable. As such, variations in the optical position value readings may be negligible so as to negate the need for calibration. Alternatively, a single optical position value reading can be made while the shaft 206 is in the fully contracted resting position, which could be used as the zero-displacement point and could be used whether the linear optical sensor assembly 700 is an absolute position sensor or an incremental position sensor.

Additionally still, these disclosed embodiments may enable calibration of the system as a whole to account for variations in, for example, the spring 210. A calibration step could be utilized during assembly to exert a calibrated tension force ($F_T$) (e.g., an ideal center tension force) on the shaft 206, wherein the particular sensor 212 used can record that value (e.g., measured strain/tension and/or displacement distance) as a calibrated value for the ideal center tension force.

These are but a few examples of implementation of polychotomous sensor types within a cable pull switch 200. Many other sensor types may be utilized that provide data or readings beyond the simple on/off or open/closed status of contact switches. As is made apparent, the versatility of a polychotomous sensor and the additional data it provides can be useful to implement a bevy of features and/or improvements.

Figure 9:
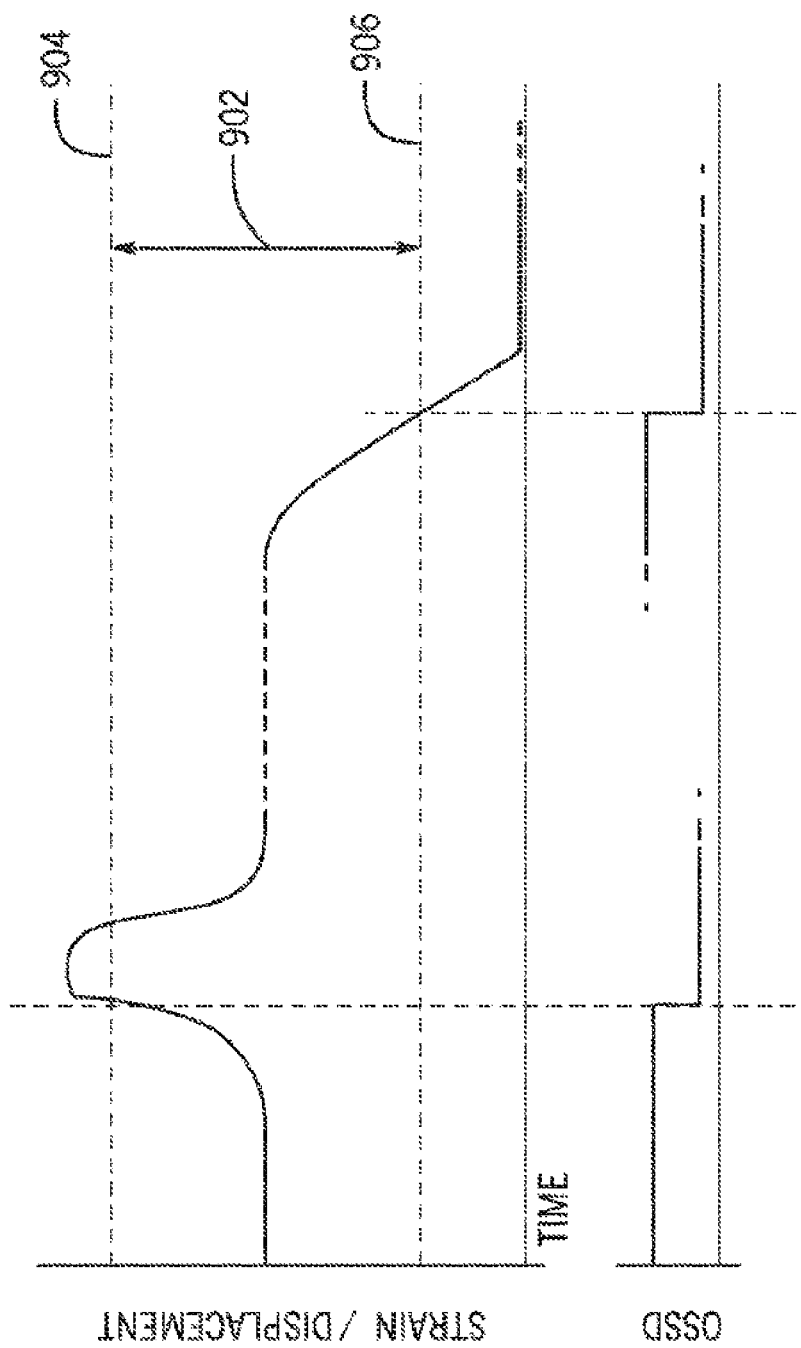
FIG. 9 illustrates various operational aspects of the cable pull switch of FIG. 2 in accordance with various embodiments.

Turning now to FIG. 9, various operational aspects of the improved cable pull switch 200 are illustrated in accordance with various embodiments. Shown here is a graph of a sensed value (Y-axis) over time (X-axis). The sensed value may be a strain value (e.g., corresponding to a tension force $F_T$ exerted on the cable pull switch) or a displacement value (e.g., corresponding to the displacement distance of the shaft 206). For example, the sensed value may be a value of the electrical resistance through a strain gauge 304, which corresponds to a strain or tension exerted by the pull cable 106. The sensed value may be a value of the electrical inductance as measured by an inductance sensor 502, which may correspond to a displacement distance of the end of the pull cable 106. Similarly, the sensed value may be a value of displacement from a linear optical sensor array 702, which may correspond to a displacement distance of the end of the pull cable 106. In various embodiments, the values (e.g., strain/tension and/or displacement distance) may be proportional (e.g., linearly proportionate), for example, according to Hooke's law for springs.

A non-tripped value window 902 is illustrated including a pull threshold value 904 defining a first side of the window 902 and a slack threshold value 906 defining a second side of the window 902. When the value of the tension or displacement is within the non-tripped value window 902 (e.g., after a reset or initialization), the cable pull switch 200 effects an output indicative of a non-tripped condition. Here, as is shown initially, an Output Signal Switching Device ("OSSD") output (e.g., as may be output from the cable pull switch 200 via the communication port 222) is high when the sensed value is within the non-tripped value window 902, indicating an absence of a trip condition (e.g., the absence of a cable pull event or a slack event).

The sensed value may be relatively steady and unchanging at a set tension or displacement distance (e.g., corresponding to the set tension for the system). However, upon a cable pull event, the tension and/or displacement distance may increase, typically rapidly, as a user grabs and yanks on the pull cable 106. This is illustrated as the upward spike in tension or displacement. As the tension or displacement increases, it will exceed the pull threshold value 904 such that the sensed value is outside of the non-tripped value window 902 on its first side (e.g., exceeds the pull threshold value 904). At this point, a processing device 214 will determine the occurrence of a cable pull event and will generate an output signal indicative of the same. As is shown here, the OSSD signal goes from a high state to a low state, indicating a cable pull event.

FIG. 9 also illustrates a cable slack event. After the occurrence of the cable pull event, a reset may take place to reset the OSSD signal to a non-tripped high state (though, a cable slack event can occur at any time). A cable slack event may occur, for example, in an instance where the pull cable 106 may be cut, a cable clamp 122 may have slipped, a cable tensioner 108 may have failed, or thermal expansion caused the pull cable 106 to expand such that the tension or displacement dropped below a slack threshold value 906. In such an instance, the sensed tension or displacement value may fall below the slack threshold value 906 such that the sensed value is outside of the non-tripped value window 902 on its second side. At this point, the processing device 214 can determine the occurrence of a cable slack event and can generate an output signal indicative of the same. As is shown here, the OSSD signal goes from a high state to a low state, indicating a cable slack event.

Many other variations are possible. For example, separate or multiple output signals may be provided for each condition and additional data may be output as to, for example, the highest/lowest sensed value, a rate of change of the value, or other data. This data may be used by, for example, a system management computer or other device. Also, although the pull threshold value 904 is shown as greater than the slack threshold value 906 (as would correspond to actual tensions on the pull cable 106 or displacement distance of the shaft 206), various polychotomous sensors 212 may be configured so that increasing tension on the pull cable 106 results in a decreased sensed value. In such a reversed approach, the first side of the non-tripped value window 902 would be the lower end defined by the pull threshold value 904 and the second side of the non-tripped value window 902 would be the upper end and defined by the slack threshold value 906.

Figure 10:
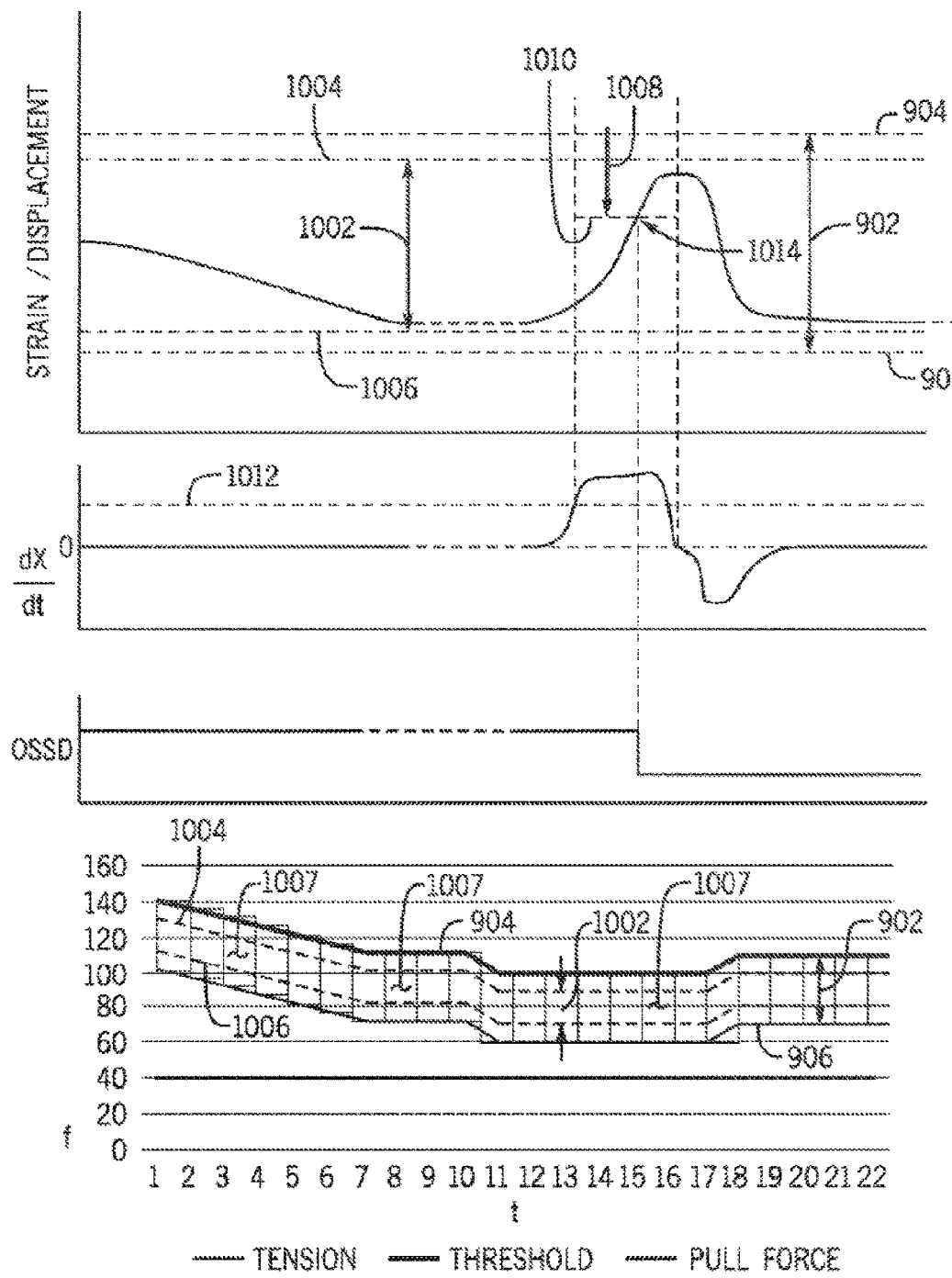
FIG. 10 illustrates various other operational features of the cable pull switch of FIG. 2 in accordance with various embodiments.

Turning now to FIG. 10, optional features of the cable pull switch 200 are illustrated in accordance with various embodiments Like the non-tripped value window 902 (also shown in FIG. 10), an adjustment value window 1002 may also exist. This adjustment value window 1002 may be narrower than the non-tripped value window 902 and may be defined on a first side by a pull adjustment margin threshold value 1004 representing a value that is within the non-tripped value window 902 by a margin from the pull threshold value 904. For example, in a configuration where the pull threshold value 904 is greater than the slack threshold value 906 (as is shown in FIGS. 9 and 10), the pull adjustment margin threshold value 1004 is an upper pull adjustment margin threshold value 1004 and is less than the pull threshold value 904. Similarly, the adjustment value window 1002 may be defined on a second side by a slack adjustment margin threshold value 1006 representing a value that is within the non-tripped value window 902 by a margin from the slack threshold value 906. As is shown in FIG. 10, the slack adjustment margin threshold value 1006 is a lower slack adjustment margin threshold value 1006 and is greater than the slack threshold value 906. The adjustment value window 1002 may be useful, for example, during tension adjustment of the pull cable 106 (e.g., during installation and/or maintenance) to provide a narrower window in which the tension of the pull cable 106 should be adjusted to keep the normal operation tension of the pull cable 106 closer to an ideal tension that is away from the edges of the non-tripped value window 902. Additionally, if the tension of pull cable 106 approaches the pull adjustment margin threshold value 1004 or the slack adjustment margin threshold value 1006, the indicator 218 (see FIG. 2) may be triggered to provide a visual or audible notification that the tension of pull cable 106 requires adjustment.

However, a situation may occur in normal use where thermal expansion causes the pull cable 106 to heat up and expand (e.g., in a warm environment, in use outdoors, etc.). If the tension of the pull cable 106 is adjusted while the cable is cool, as the cable heats up, it will expand slowly so as to reduce the tension and/or displacement at the cable pull switch 200. This is illustrated in the first portion (left portion) of FIG. 10, where the strain or displacement slowly drops. This first portion of FIG. 10 is shown compressed over time and the actual expansion of the cable may take many minutes or hours. After a time, the tension and/or displacement at the cable pull switch 200 may be near or below the lower slack adjustment margin threshold value 1006. If the tension/displacement stays within the adjustment value window 1002, no alarm or warning should be issued. However, in certain embodiments, if the tension/displacement exits the adjustment value window 1002 (e.g., by dropping below the lower slack adjustment margin threshold value 1006), an alarm or warning may be effected indicating adjustment may be required, however normal operation of associated machinery may continue in some embodiments. If the tension/displacement drops low enough to exit the non-tripped value window 902 (e.g., by dropping below the slack threshold value 906), a cable slack event would be detected and an appropriate output signal could be effected indicating the same, at which point associated machinery could be stopped. Similarly, if tension of the pull cable 106 was adjusted while it was warm, as the pull cable 106 cools it will contract and could cause a similar problem by increasing the tension or displacement, possibly causing an artificial trip situation on the upper end.

These artificial trip situations could cause frustration and reduce operating efficiency of a manufacturing plant or factory (e.g., by creating unnecessary down-time on a line). Further, it could cause operators to implement work-arounds to avoid these artificial trip situations (for example, by wrapping the pull cable around a near eyelet) to avoid thermal expansion/contraction from falsely tripping the cable pull switch 200. These work-arounds could eviscerate the purpose of the cable pull switch 200. Accordingly, to avoid frustration, reduce down-time, and avoid unsafe work-arounds, various measures can be implemented that take advantage of the extra data provided by the polychotomous sensor 212.

In one embodiment, the cable pull switch 200 may determine a rate of change (e.g., a first order derivative) of the strain or displacement. This rate of change is shown as dX/dt in FIG. 10, where X is either displacement distance or strain/tension and where t is time. The rate of change may correspond to velocity, in some embodiments. In one embodiment, if the rate of change is slow enough (e.g., below a threshold rate of change value), the processing device 214 in the cable pull switch 200 may periodically adjust one or more of the threshold values at a fixed interval according to a present value of the sensed value (e.g., strain/tension or displacement distance). For example, the threshold rate of change value can be about 10 newtons ("N") to about 90 N over a time period. In one embodiment, the time period can be one second; however, the time period can be more than one second (e.g. one minute, one hour, etc.). Alternatively, the time period can be less than one second (e.g., one millisecond, one nanosecond, etc.), or any other time period as applicable. In one specific embodiment, the threshold rate of change value can be 30 N over a one second period.

The cable pull switch 200 can monitor the sensed value continuously or at predetermined timed intervals, and can adjust the threshold values to maintain a constant pull force regardless of changes in the sensed value so from a user perspective, the user does not have to apply a greater pull force to trip the switch 200 as heat, wear and natural stresses cause the cable tension to drop below an ideal tension over time. A floating window 1007 can be implemented in firmware in the cable pull switch 200 with the pull threshold value 904 and the slack threshold value 906 changing over time as processing device 214 can continuously measure the tension in the pull cable 106 and update the base tension of each window 1007 at a fixed interval of time. Gradual changes in tension can move the window up or down by adjusting the pull threshold values 904 and the slack threshold values 906, bounded by a minimum tension (as a non-limiting example 10 N) and a maximum pulled tension (as a non-limiting example 180 N). By implementing the floating windows 1007, the cable pull switch 200 can tolerate changes to the environment but it can still be triggered by a user.

For example, if thermal expansion were to reduce the strain/tension or displacement distance, and the rate of change was slow enough (e.g., minutes, hours, or possibly so slow as to be imperceptible) so as not to confuse the slow change in strain/tension or displacement distance with a fast change from a cable cut event or another cable failure, the cable pull switch 200 may lower the thresholds 904 and/or 906 defining the non-trip value window 902. Similarly, the system may lower the thresholds 1004 and/or 1006 defining the adjustment value window 1002. In some embodiments, the adjustment amount may be limited by an allowable adjustment amount (as non-limiting examples, +/−25%, +/−10 mm displacement distance, etc.) and/or an absolute lower or upper value (e.g., a lower slack threshold value 906 cannot be less than a 10 mm displacement distance, etc.). By this, the cable pull switch 200 can accommodate normal thermal expansion and contraction without falsely tripping the system, as long as the tension/displacement of the pull cable 106 remains within minimum safe operating conditions (e.g., not too much slack so that the shaft 206 is non-responsive to a cable pull event, and not too much tension/displacement so that a cable pull event would exceed the maximum tension or displacement sensing abilities of the cable pull switch 200). Further, in a similar manner as is discussed below, by lowering an upper pull threshold value 904 when thermal expansion occurs, the likelihood that the cable pull event is actually detected can increase.

With continued reference to FIG. 10, the right portion of the graph (after the dashed lines, which indicates passage of time) shows a cable pull event. Like in FIG. 9, a strain/tension or a displacement distance is increased sharply in response to a user pulling on the pull cable 106. If the pull cable 106 had expanded due to thermal expansion (so that the normal resting tension/displacement was low, possibly near or below a lower slack adjustment margin threshold value 1006), and if a user did not pull on the pull cable 106 with substantial force, a prior art cable pull switch may not register the cable pull event as the force or distance may not be enough to enable the mechanical contacts of the switch to be thrown. A similar situation may occur if the pull threshold value 904 is not adjusted.

In accordance with one embodiment, the cable pull switch 200 (and particularly the processing device 214) may take the rate of change (dX/dt) of the sensed value into account when determining whether a cable pull event has occurred. In one approach, the cable pull switch 200 may adjust 1008 (e.g., lower) the cable pull value threshold 904 to a new (e.g., lower) cable pull value threshold 1010 if the rate of change of the sensed value exceeds a rate of change threshold value 1012. As is seen in FIG. 10, the rate of change dX/dt exceeded the rate of change threshold value 1012 and the upper cable pull value threshold 904 was lowered to a new cable pull threshold value 1010. Once the measured strain/tension or displacement exceeded the new lowered cable pull threshold value 1010 at point 1014, a cable pull event was determined to have occurred and the OSSD outputs were changed to indicate the occurrence of the cable pull event.

In one embodiment, the new lowered cable pull threshold 1010 may remain in effect for as long as the rate of change dX/dt exceeds the rate of change threshold value 1012. In another embodiment, once the rate of change dX/dt exceeded the rate of change threshold value 1012, the new lowered cable pull threshold 1010 may remain in effect for a set period of time (e.g., 1 or 2 seconds, etc.), or, in an alternative embodiment, until the rate of change dX/dt became negative (as shown in FIG. 10, corresponding to a release of the pull cable 106). In another approach, a negative rate of change threshold value (not shown) may be the same value (e.g., but negative) or a different value than the rate of change threshold value 1012 according to the requirements of a particular application setting. In one approach, the rate of change may be an absolute value of the rate of change (e.g., |dX/dt|) so that a negative rate of change will also "exceed" the rate of change threshold value 1012.

In another approach, the system may not adjust thresholds, but may simply look to the rate of change dX/dt to indicate the occurrence of a cable pull event. For example, the system may determine whether the rate of change exceeds the rate of change threshold value 1012 for a certain time period (e.g., 0.2 or 0.5 seconds, etc.), which may serve to filter out any unintended vibrations that may briefly increase the rate of change, while allowing a true cable pull event to be registered solely by the rate of change. Many other variations are possible.

Figure 11:
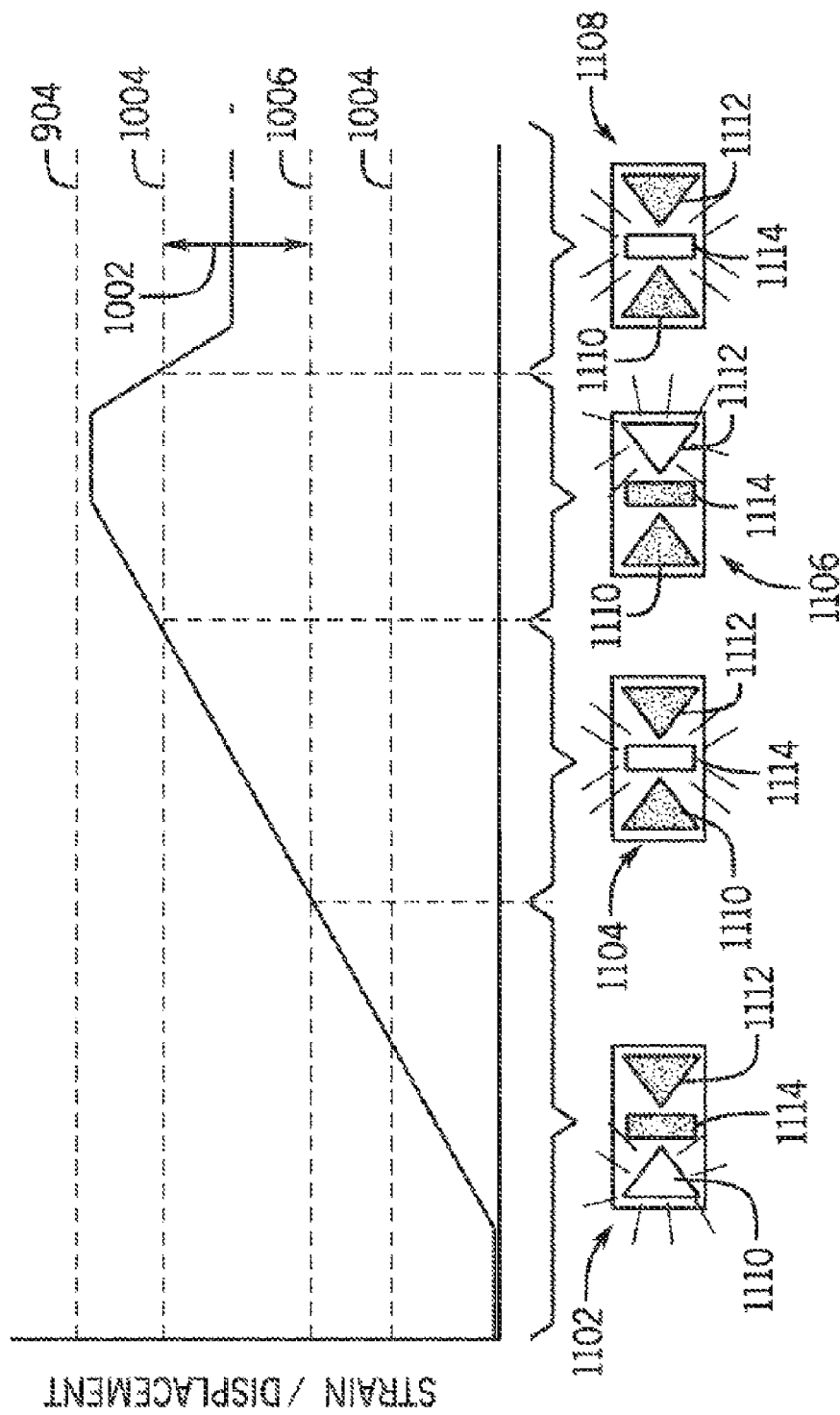
FIG. 11 illustrates yet other operational features of the cable pull switch of FIG. 2 in accordance with various embodiments.

Turning now to FIG. 11, another feature of the improved cable pull switch 200 is illustrated in accordance with various embodiments. During installation and/or maintenance, the tension/displacement of the pull cable 106 may be adjusted to be at a suitable tension/displacement. In one approach, an indicator 218 (see FIG. 2) is provided, for example, on the body 202 of the cable pull switch 200. The indicator 218 may be an audible indicator (e.g., to emanate an audible tone) or a visual indicator. An example visual indicator is shown at 1102, 1104, 1106, and 1108, illustrating a single visual indicator at various times during installation/maintenance (reference is generally made to visual indicator 1102, but may pertain to all instances 1102, 1104, 1106, and 1108 of the visual indicator 1102). The visual indicator 1102 may include a first illuminator 1110 indicating a requirement to increase tension exerted on the pull cable 106, a second illuminator 1112 indicating a requirement to decrease the tension exerted on the pull cable 106, and, optionally, a third illuminator 1114 indicating the tension exerted on the pull cable 106 is acceptable. The illuminators 1110, 1112, and 1114 may be light emitting diodes (LEDs), though other illuminator types may be possible. The illuminators 1110, 1112, and 1114 may be differing colors according to different functions (e.g., red or yellow for the first illuminator 1110 and/or the second illuminator 1112, green or blue for the third illuminator 1114, though many other variations are possible). Further, in another embodiment, a single illuminator is used to convey through color (e.g., red for too much/too little tension, green for acceptable tension) and/or blinking rate (a slow blink rate when too much/too little tension and gradually speeding up to solid illumination when adjusted to an acceptable tension amount, or vice-versa) to provide similar functionality and/or status information as is described below.

In operation, and in accordance with various embodiments, the visual indicator 1102 can provide an illuminated visual indication to provide a user with visual feedback of pull cable 106 tension during tension adjustment. In one embodiment, though not every embodiment, the cable pull switch 200 may enter a tension adjustment state wherein the visual indicator 1102 is active. However, in other embodiments, the visual indicator 1102 may provide the disclosed functionality and status feedback whenever the cable pull switch 200 is powered without the need to enter a tension adjustment state.

In a first operational state, as is shown with visual indicator 1102, the tension/displacement is below the slack adjustment margin threshold value 1006. When in this state, the first illuminator 1110 may be illuminated (indicating a requirement to increase the tension) while the second illuminator 1112 and the third illuminator 1114 are dark. As the tension is increased and as the tension exceeds the slack adjustment margin threshold value 1006 such that it is within an acceptable range (e.g., within an adjustment value window 1002), the visual indicator enters a second operational state shown at 1104 wherein the third illuminator 1114 may be illuminated (indicating an acceptable tension) while the first illuminator 1110 and the second illuminator 1112 are dark. If the tension continues to increase and exceeds the upper pull adjustment margin threshold value 1004, the visual indicator enters a third operational state shown at 1106 wherein the second illuminator 1112 may be illuminated (indicating a requirement to decrease the tension) while the first illuminator 1110 and the third illuminator 1114 are dark. The installer can then lower the tension until the tension is back within the adjustment value window 1002, wherein the visual indicator re-enters the second operational state as is shown at 1108, which is identical to 1104. By this, an installer can be provided with a visual indication that is viewable from a distance (e.g., possibly up to 25-50 meters) so that as tension adjustments are made away from the ends of the pull cable 106 (for example, at a tensioner or a turnbuckle in the middle of the pull cable 106), the installer is not required to make multiple iterative trips back and forth between the cable pull switch 200 and the adjustment point on the pull cable 106, thereby saving time and improving convenience and usability of the cable pull switch 200.

Varying brightness and or blinking rates can be used with the multiple illuminators 1110, 1112, and 1114 to provide even more detailed feedback to a user. For example, when the tension of the pull cable 106 is within the adjustment value window 1002 for acceptable tension but near the thresholds 1004 or 1006, the third illuminator 1114 may blink slowly or be dimly illuminated, which blinking or brightness may increase eventually to solid or full bright as the tension is adjusted to be near the middle of the adjustment value window 1002 and/or the ideal tension value. Similar effects can be provided for the first illuminator 1110 and the second illuminator 1112.

Turning now to FIG. 12, an example state table is provided in accordance with various embodiments. In addition to the visual indicator 1102 described above, or as part of the same visual indicator 218, a status LED illuminator may be included on the body 202 of the cable pull switch 200 to provide visual indication of a present operational status of the cable pull switch 200. This status LED may be the same as or separate from the illuminators 1112, 1114, or 1116. Similarly, the communication port 222 may include the primary OSSD output and may include a second auxiliary output signal (e.g., AUX). These outputs may be provided on separate and distinct conductors or terminal pins, or may be contained with a serial communication protocol.

Various example states are shown in FIG. 12 in accordance with various embodiments. However, one of skill in the art will readily recognize that many variations are possible and are within the ambit of this disclosure. An initialization state 1202 may be entered upon initial power up or at other periodic intervals (e.g., once a day) to self check, establish communication, and/or for any other suitable purpose. The OSSD output may remain low (indicating a "do not run" condition to the associated machinery) while the AUX output may remain high. The status LED may provide a yellow illumination. An OFF state 1204 may be entered if the cable pull switch 200 is not running and has a tension that may require adjustment. The status LED may be red as a result and the OSSD output may remain low. A tensioned off state 1206 may be entered if the cable pull switch 200 is not running but has an acceptable tension on the pull cable 106. The status LED may be red and yellow, while the OSSD output remains low. A user can hit a reset button 114 and begin/resume a normal tensioned run state 1208. The normal tensioned run state 1208 is the normal operating state when the tension is acceptable and the cable pull switch 200 is on. The OSSD output will be high and the status LED may provide a green light. If the pull cable 106 is pulled, the cable pull switch 200 may enter a pulled state 1210 wherein the OSSD output will go low and the status LED may be illuminated solid red. Similarly, if the pull cable 106 goes slack, the cable pull switch 200 may enter a slack state 1212 wherein the OSSD output will go low and the status LED may be illuminated blinking red. If the tension on the pull cable 106 increases or decreases (e.g., due to thermal expansion or contraction) outside of an adjustment value window 1002, or outside of a different marginal tension window (for example, which may be smaller than the non-tripped value window 902 but larger than the adjustment value window 1002), the cable pull switch 200 may enter a marginal tension run state 1214 wherein the OSSD outputs will remain high (allowing the machinery to operate) but the status LED may blink green, thereby providing a warning that the tension is close to an artificial trip point and may require adjustment. The communication module 216 may provide outbound communication of any of these states, for example, to a central control computer or system, to provide feedback to a system manager of a current status and/or requirement to adjust tension of a particular pull cable 106.

Figure 13:
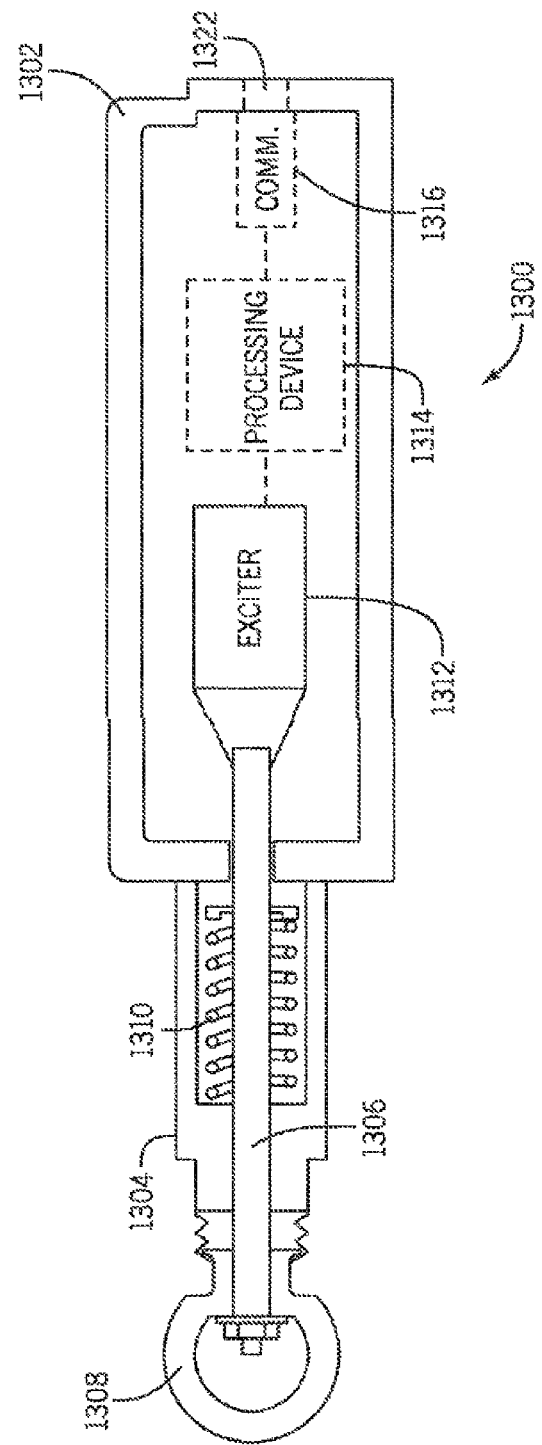
FIG. 13 shows a pull cable excitation module 1300 in accordance with various embodiments.

Turning now to FIG. 13, a pull cable excitation module 1300 is illustrated in accordance with various embodiments. The pull cable excitation module 1300 may, though not necessarily, include many of the same features and elements as the cable pull switch 200, including a housing 1302, a tubular body extension 1304, a shaft 1306, a D-ring 1308, and a spring 1310. In certain embodiments, the pull cable excitation module 1300 may even include a polychotomous sensor and/or an optional processing device 1314 in much the same manner as the cable pull switch 200 to perform the same or similar functionality as the cable pull switch 200 described above in addition to the additional features described below. Alternatively, the pull cable excitation module 1300 may not perform the same functions as the cable pull switch 200 and may instead be a separate dedicated functioning element according to the description below. A communication module 1316 and communication port 1322 may also be included, for example, as described above with respect to communication module 216 and communication port 222. The communication module 1316 may effect communication with a cooperating cable pull switch 200 to initiate a pull cable excitation state.

In various embodiments, the pull cable excitation module 1300 also includes a cable exciter 1312 mechanically coupled to the shaft 1306. The exciter 1312 may be a servo motor, a linear actuator, or another actuator capable of manipulating the shaft 1306. The exciter 1312 can, in turn, induce a mechanical tension or vibration onto the pull cable 106.

Figure 14:
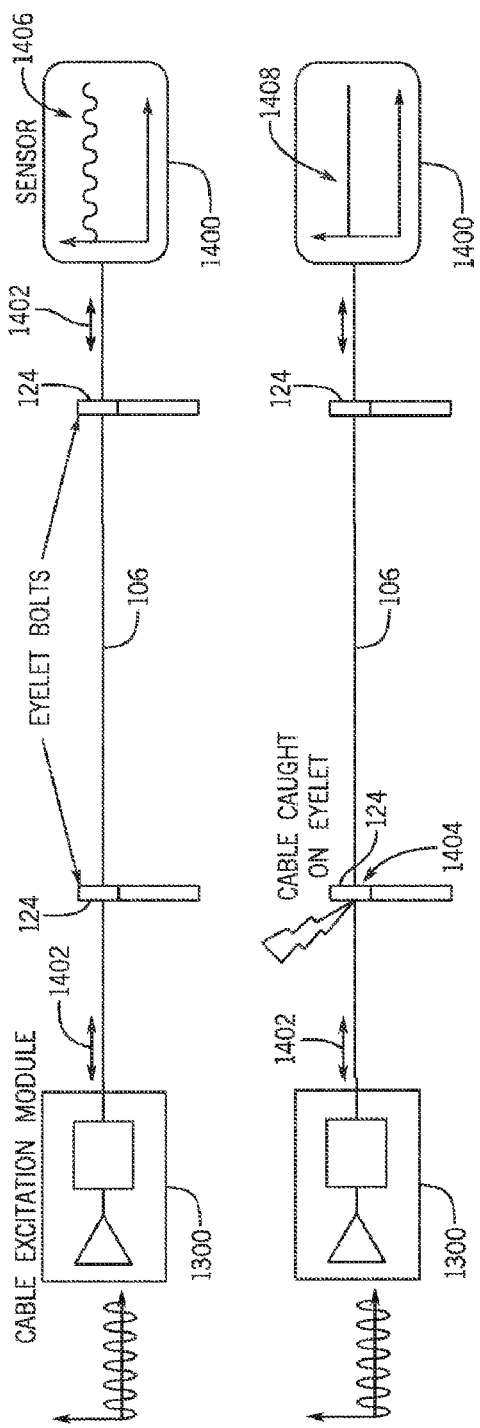
FIG. 14 shows a cable pull system illustrating functional aspects of the pull cable excitation module 1300 in accordance with various embodiments.

Turning now to FIG. 14, operation of the pull cable excitation module 1300 is illustrated in accordance with various embodiments. Coupled to a first end of the pull cable 106 is a cable pull switch 1400 (which may be the same as cable pull switch 200 and may include additional features now described) and attached to the second end of the pull cable 106 is the pull cable excitation module 1300. In operation, the pull cable excitation module 1300 and the cable pull switch 1400 can enter a cable excitation state. The pull cable excitation module 1300 can communicate with the cable pull switch 1400 to initiate the cable excitation state, and either the pull cable excitation module 1300 or the cable pull switch 1400 can initiate the cable excitation state. Alternatively or additionally, a separate master controller (not shown) can communicate with one or both of the pull cable excitation module 1300 or the cable pull switch 1400 to initiate the cable excitation state. The cable excitation state can be manually entered (e.g., by a user), or may periodically scheduled to ensure proper operation of the cable pull system. Once in the cable excitation state, the pull cable excitation module 1300 induces a varying tension 1402 onto the pull cable 106 by altering the tension exerted on the pull cable 106. This varying tension 1402 can most likely translate to linear movement of the pull cable 106. The varying tension 1402 may be varied in a slow or quick manner, may be a random pattern or a repeating pattern, and may be varied by small amounts (e.g., less than would normally be required for a cable pull event) and/or large amounts (e.g., more than would normally be required for a cable pull event).

The cable pull switch 1400 can detect at the first end of the pull cable 106 the varying tension 1402 exerted on the second of the pull cable 106 by the pull cable excitation module 1300. The detection may be made through one of the various polychotomous sensor techniques discussed above or via another sensing method. If the pull cable 106 is free of obstructions or other failures (e.g., is not caught on an eye bolt 124), then the cable pull switch 1400 will detect the varying movement 1402 as is shown at 1406. Conversely, if the pull cable 106 is obstructed or is experiencing a condition that prevents translation of the varying tension 1402 (e.g., the pull cable 106 is caught in an eye bolt 124 shown at 1404), the cable pull switch 1400 may fail to detect the varying tension 1402, or fail to detect the varying tension 1402 at an acceptable amplitude as is shown at 1408. In such an instance, the cable pull switch 1400 may generate an output signal indicative of a pull cable failure. By this, the cable pull system is tested to avoid a situation wherein the cable pull switch 1400 is inhibited from properly sensing a true cable pull event through obstruction or other pull cable failure. This also prevents a need for maintenance personnel to manually check the pull cables on a regular basis.

In other embodiments, the pull cable excitation module 1300 may attempt to clear or remove an obstruction or remedy a cable failure by exerting larger and/or quick tension bursts onto the pull cable 106. The pull cable 106 can be retested thereafter. The pull cable excitation module 1300 may also log the cable failure event so that it can be remedied and/or addressed later.

Figure 15:
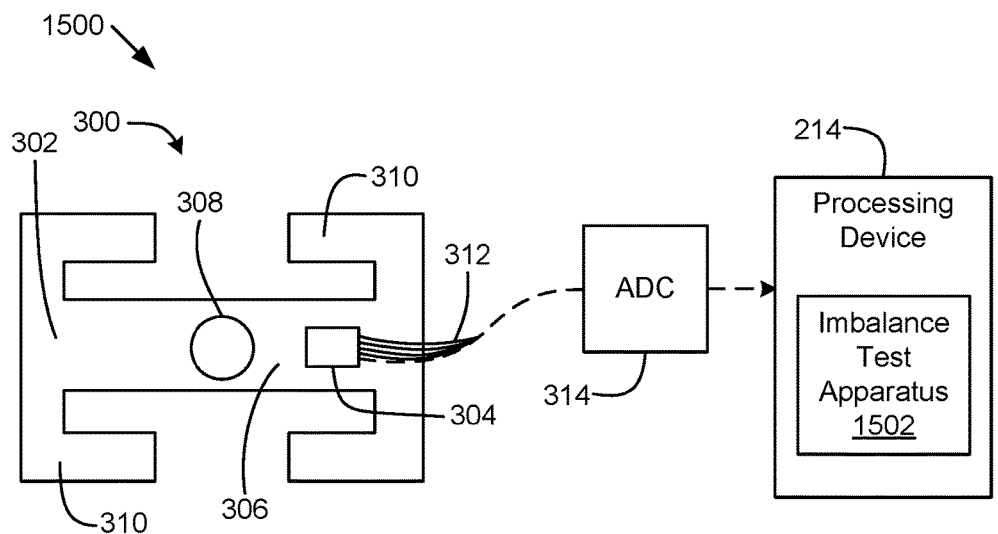
FIG. 15 is a schematic block diagram illustrating an apparatus with an example strain gauge assembly with one embodiment of a processing device with an imbalance test apparatus.

FIG. 15 is a schematic block diagram illustrating an apparatus 1500 with an example strain gauge assembly 300 with one embodiment of a processing device 214 with an imbalance test apparatus 1502. The strain gauge assembly 300 includes a substrate 302 with a strain gauge 304, a member 306, one or more holes 308, one or more tabs 310, electrical wiring 312, and an analog-to-digital converter ("ADC") 314, which are substantially similar to those described above. The apparatus 1500 also includes one embodiment of a processing device 214, which is also substantially similar to the processing devices 214 described above and may also include additional functionality of an imbalance test apparatus 1502, as described below.

Figure 16:
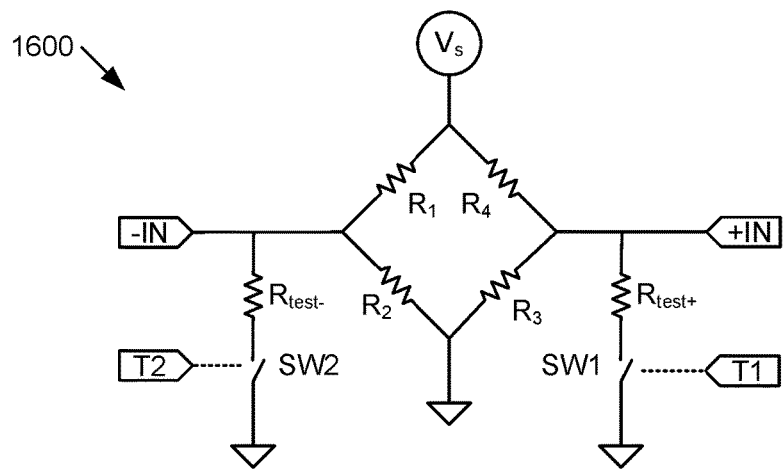
FIG. 16 is a partial circuit diagram illustrating one embodiment of a strain gauge with test resistors.

FIG. 16 is a partial circuit diagram illustrating one embodiment of a strain gauge 1600 with test resistors $R_{test-}$, $R_{test+}$. The strain gauge 1600 may include the functionality of the strain gauges 304 described above. In the depicted embodiment, the strain gauge 1600 includes a Wheatstone bridge with four resistors $R_1$, $R_2$, $R_3$ and $R_4$ (collectively or generically "R") where resistors $R_1$ and $R_4$ are connected to a voltage source $V_s$. Resistors $R_2$ sand $R_3$ are connected to ground or other reference and $R_1$ and $R_2$ form one voltage divider with midpoint −IN and resistors $R_3$ and $R_4$ form another voltage divider with midpoint +IN where strain voltage $V_{strain}$ is the voltage difference between the midpoints (i.e. $V_{+IN}-V_{-IN}$). A first test resistor $R_{test+}$ is connected in parallel with resistor $R_3$ when a first switch SW1 is closed. A second test resistor $R_{test-}$ is connected in parallel with resistor $R_2$ when a second switch SW2 is closed.

In one embodiment, the test resistors $R_{test+}$, $R_{test-}$ and switches SW1, SW2 are located external to a strain gauge circuit connected to the member 306 of the strain gauge assembly 300. For example, the test resistors $R_{test+}$, $R_{test-}$ and switches SW1, SW2 may be part of a circuit board, processing device 214 or another location and leads from the test resistors $R_{test+}$, $R_{test-}$ to the midpoints +IN, −IN of the strain gauge 1600 may bypass the ADC 314. In another embodiment, the test resistors $R_{test+}$, $R_{test-}$ and switches SW1, SW2 may be included in a strain gauge chip. One of skill in the art will recognize other ways to integrate the test resistors $R_{test+}$, $R_{test-}$ and switches SW1, SW2 with a strain gauge.

At least one of the resistors $R_1$, $R_2$, $R_3$, or $R_4$ of the strain gauge 1600 change as force is applied to the member 306 of the strain gauge assembly 300. In some embodiments, resistance of a single resistor (e.g. $R_1$) changes in response to the force. In another embodiment, the resistance of two resistors (e.g. $R_1$, $R_4$ or $R_2$, $R_3$) changes in response to the force. In another embodiment, resistance changes on all of the resistors $R_1$, $R_2$, $R_3$, $R_4$ of the strain gauge 1600 in response to the force.

Typically, the resistors R are balanced with a tight tolerance and the resistance change may be small so the strain voltage $V_{strain}$ is measured in millivolts. Over time, the resistance of one or more of the resistors R of the strain gauge 1600 may change due to age, heat, mechanical forces, etc. Where the resistors R of the strain gauge 1600 change, measurement of the strain voltage $V_{strain}$ is affected, which may cause errors. The errors may then affect operation of the chain pull system 100. The resistors $R_1$, $R_2$, $R_3$, or $R_4$ of the strain gauge 1600 may be used to determine if resistance of the resistors R of the strain gauge has changed enough to be a problem.

The test resistors $R_{test+}$, $R_{test-}$ are matched to the resistors R of the strain gauge 1600 to cause a voltage shift of voltage across the terminals +IN, −IN of the strain gauge 1600 much higher than changes in resistance of the resistors R of the strain gauge 1600. The test resistors $R_{test+}$, $R_{test-}$ are also selected so that a voltage shift, when a switch SW1 or SW2 is closed, remains within a voltage range appropriate for the power supply $V_s$. For example, strain voltage measurements may have a range that is less than about 30% of a voltage shift caused by closing a switch (e.g. SW1) to connect a test resistor $R_{test+}$. Other embodiments may include a lower range, such as 20%, 10%, 5%, etc.

For example, where the resistors R of the strain gauge 1600 are all equal at 350 ohms with no force on the strain gauge 1600, the test resistors $R_{test+}$, $R_{test-}$ may be 121 kilo ("k") ohms. In this case, a ratio of a measurement of voltage across the terminals +IN, −IN of the strain gauge 1600 to a supply voltage $V_s$ is 0.5 and variations of the strain voltage measurements are in the millivoltage range. Where the resistances $R_1$, $R_2$, $R_3$, $R_4$ of the strain gauge 1600 have changed based on a particular force resulting in a particular strain voltage $V_{strain}$, closing a switch (e.g. SW1) to connect a test resistor (e.g. $R_{test+}$) typically results in a difference voltage $V_{diff}$ that is substantially the same as the difference voltage $V_{diff}$ for a different measured strain voltage $V_{strain}$ with different resistance values.

The switches SW1, SW2 may include any type of switch capable of carrying current through the test resistor $R_{test+}$, $R_{test-}$ and resistors R of the strain gauge 1600 and fast enough to allow for multiple measurements for a particular strain voltage measurement or test voltage measurement. Where the timing between measurements is on the order of 10 microseconds, the switches SW1, SW2 typically have a switching time much less than 10 microseconds. The switches SW1, SW2 may be semiconductor switches, such as bipolar junction transistors, insulated-gate bipolar transistors, metal-oxide semiconductor field effect transistors, and the like, or may include a mechanical switch capable of opening and closing much faster than switching requirements for strain voltage and test voltage measurements.

Figure 17:
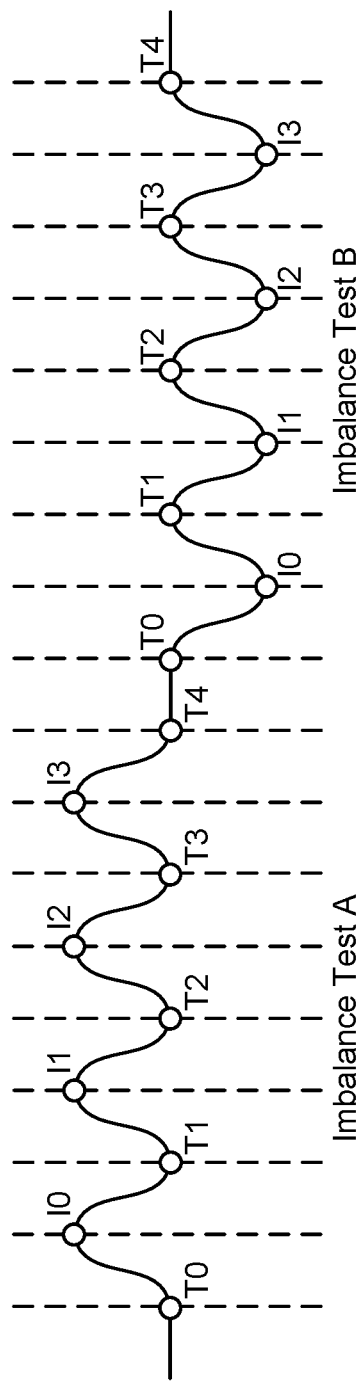
FIG. 17 is a timing diagram illustrating one embodiment of imbalance testing.

FIG. 17 is a timing diagram 1700 illustrating one embodiment of imbalance testing. In the embodiment, strain voltage $V_{strain}$ measurements are depicted with a "T" at times T0, T1, T2, T3 and T4. Imbalance test measurements are depicted with an "I" at times I0, I1, I2 and I3. Vertical dashed lines represent measurement times and time is on a horizontal axis (not shown) and a vertical axis (not shown) represents voltage across the terminals +IN, −IN of the strain gauge 1600. The solid line connecting the measurement values represents voltage across the terminals +IN, −IN of the strain gauge 1600. However, the actual voltage across the terminals +IN, −IN of the strain gauge 1600 may trace different paths over time than depicted and the trace is merely illustrative.

The imbalance test begins with the imbalance test apparatus 1502 taking a first strain voltage $V_{strain}$ measurement at T0 where switches SW1 and SW2 are open so that the voltage across the terminals +IN, −IN of the strain gauge 1600 is strain voltage $V_{strain}$ and corresponds to an amount of force on the strain gauge 1600. The imbalance test apparatus 1502 closes a switch (e.g. SW1) and measures a test voltage $V_{test}$ across the terminals +IN, −IN of the strain gauge 1600. The imbalance test apparatus 1502 opens the switch SW1 and at a next measurement time, the imbalance test apparatus 1502 measures a second strain voltage $V_{strain}$ labeled T1.

The imbalance test apparatus 1502 continues to close and open the switch SW1 and to measure strain voltages $V_{strain}$ and test voltages $V_{test}$ as depicted to obtain voltages T2, T3, T4, I1, I2 and I3, which are part of Imbalance Test A. Imbalance Test B is similar to Imbalance Test A except the imbalance test apparatus 1502 closes the second switch SW2. The imbalance testing is described further with regard to FIGS. 18 and 19. While the timing diagram illustrates four test voltage $V_{test}$ measurements and five strain voltage $V_{strain}$ measurements, the imbalance test apparatus 1502 may take more or less voltage measurements in an imbalance test than are shown in FIG. 17.

Figure 18:
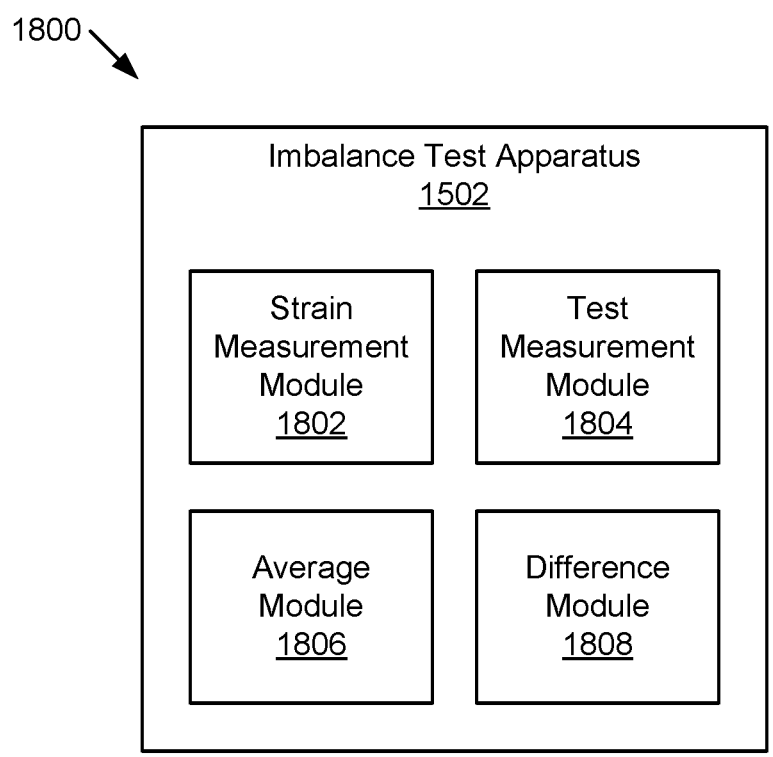
FIG. 18 is a schematic block diagram illustrating one embodiment of the imbalance test apparatus.

FIG. 18 is a schematic block diagram illustrating one embodiment 1800 of the imbalance test apparatus 1502. The embodiment 1800 includes a version of the imbalance test apparatus 1502 with a strain measurement module 1802, a test measurement module 1804, an average module 1806 and a difference module 1808, which are described below.

The embodiment 1800 includes a strain measurement module 1802 that measures a strain voltage $V_{strain}$ across terminals of a strain gauge 1600. The measurement is without a test resistors $R_{test+}$, $R_{test-}$ connected. The strain voltage is $V_{strain}$ representative of an amount of force on the strain gauge 1600. For example, the strain voltage $V_{strain}$ is measured across terminals +IN and −IN of the strain gauge 1600. The strain voltage $V_{strain}$ may then be converted to a digital signal by the ADC 314 and send to the processing device 214. In another embodiment, the strain voltage $V_{strain}$ is sent directly to the processing device 214. The processing device 214, in one embodiment, uses the strain voltage $V_{strain}$ directly. In another embodiment, the processing device 214 includes an analog-to-digital converter and converts the measured strain voltage $V_{strain}$ to a digital value.

In one embodiment, the strain measurement module 1802 measures strain voltage $V_{strain}$ at a sampling rate. In one example, the strain measurement module 1802 measures the strain voltage $V_{strain}$ at a rate associated with a fundamental frequency of a power source that provides power to the cable pull system 100. In some embodiments, the fundamental frequency is 60 hertz ("Hz"). In other embodiments, the fundamental frequency is 50 Hz. The cable pull system 100 may be designed to work with 60 Hz or 50 Hz. Other embodiments are powered by a power source of a different fundamental frequency, such as 400 Hz.

The sampling rate may be chosen to take several measurements during a cycle of the power source. For example, the strain measurement module 1802 may measure strain voltage $V_{strain}$ with a particular number of measurements at a particular sampling rate. The sampling rate may be chosen to work with 60 Hz or 50 Hz, such as 55 Hz. Choosing a sampling rate that is related to the fundamental frequency of the power supply results in some digital filtering, which may help reduce measurement error. For example, where the strain voltage $V_{strain}$ and the test voltage $V_{test}$ are measured several times per cycle of the fundamental frequency, the resulting measurement may have less error than less frequent measurements. For a particular imbalance test, the strain measurement module 1802 may measure strain voltage $V_{strain}$ five times during a cycle of the sampling rate and the test measurement module 1804 may measure test voltage $V_{test}$ four times during the cycle, as depicted in relation to FIGS. 17 at T0, T1, T2, T3 and T4 and I0, I1, I2 and I3. In one embodiment, a length of time of an imbalance test is within 10 percent of a cycle of the fundamental frequency of the power source. The strain measurement module 1802 measures strain voltage $V_{strain}$ while the switches SW1 and SW2 are open.

The embodiment 1800 includes a test measurement module 1804 that measures a test voltage $V_{test}$ across the terminals +IN, −IN of the strain gauge 1600 while a test resistor (e.g. $R_{test+}$) is connected in parallel with a resistor (e.g. $R_3$) of the strain gauge 1600. The test resistor Rtest+ is connected while the test measurement module 1804 measures the test voltage $V_{test}$ and disconnected while the strain measurement module 1802 measures strain voltage $V_{strain}$.

In some embodiments, for each strain voltage measurement, the strain measurement module 1802 measures voltage of the strain gauge 1600 a plurality of times and averages the plurality of measured voltages to determine the strain voltage $V_{strain}$. In other embodiments, for each test voltage measurement, the test measurement module 1804 measures voltage of the strain gauge 1600 a plurality of times while a test resistor (e.g. $R_{test+}$) is connected in parallel with a resistor (e.g. $R_3$) and averages the plurality measured voltages to determine the test voltage $V_{test}$. In some embodiments, the plurality of voltages measured by the strain measurement module 1802 is three voltage measurements and the plurality of voltages measured by the test measurement module 1804 is three voltage measurements.

Where the strain measurement module 1802 and/or the test measurement module 1804 measure voltage a plurality of times for a particular voltage measurement, the strain measurement module 1802 and/or the test measurement module 1804 typically measures voltage of the strain gauge 1600 at rate much higher than the measurement rate between strain voltage $V_{strain}$ measurements and test voltage $V_{test}$ measurements. For example, the test measurement module 1804 and the strain measurement module 1802 alternate measurements of voltage of the strain gauge 1600 at a measurement sample rate and a rate of measurement of voltages by the strain measurement module 1802 for each strain voltage and by the test measurement module 1804 for each test voltage is much higher than the measurement sample rate.

For a 55 Hz overall measurement sample rate and for an imbalance test depicted in FIG. 17 with five strain voltage measurements and four test voltage measurements, the time between a strain voltage measurement and a test voltage measurement is 1/(55 Hz*8)=2.27 milliseconds ("mS"). The plurality of voltage measurements for a strain voltage measurement or a test voltage measurement is much less than 2.27 mS. For example, the voltage measurements may be 10 microseconds ("μS") apart, or 30 μS total where there are three voltage measurements for each strain voltage measurement or each test voltage measurement. 30 μS is about an order of magnitude less than 2.27 mS. Other measurement rates may also be used, such as 5 μS, 15 μS, etc.

The embodiment 1800 includes an average module 1806 that calculates an average strain voltage $V_{strain\ ave}$ from two strain voltage measurements (e.g. T0, T1). The strain voltages $V_{strain}$ are measured preceding and after the test voltage $V_{test}$ measurement (e.g. I0). In one embodiment, the average module 1806 measures average strain voltage $V_{strain\ ave}$ as (T0+T1)/2. While T0 and T1 are depicted at a same voltage level in FIG. 17 (e.g. same horizontal value), T0 and T1 as well as T2, T3 and T4 may each be at different voltage levels. Where each voltage measurement is measured at a uniform rate, in one embodiment, the amount of time between measurements is identical or very similar so that the average strain voltage $V_{strain\ ave}$ between T0 and T1 is at about at a same time as I0, the test voltage $V_{test}$.

The embodiment 1800 includes a difference module 1808 that determines a difference voltage $V_{diff}$. The difference voltage $V_{diff}$ includes a difference between the average strain voltage $V_{strain\ ave}$ (e.g. (T0+T1)/2) and the test voltage $V_{test}$ (e.g. I0). For example, the difference voltage $V_{diff}$ for T0, T1 and I0 may be calculated as $V_{diff1}$=I0−(T0−T1)/2. The difference voltage $V_{diff}$ may be used to determine if resistances $R_1$, $R_2$, $R_3$ and $R_4$ of the strain gauge 1600 have changed, which may indicate a problem with the strain gauge 1600.

Figure 19:
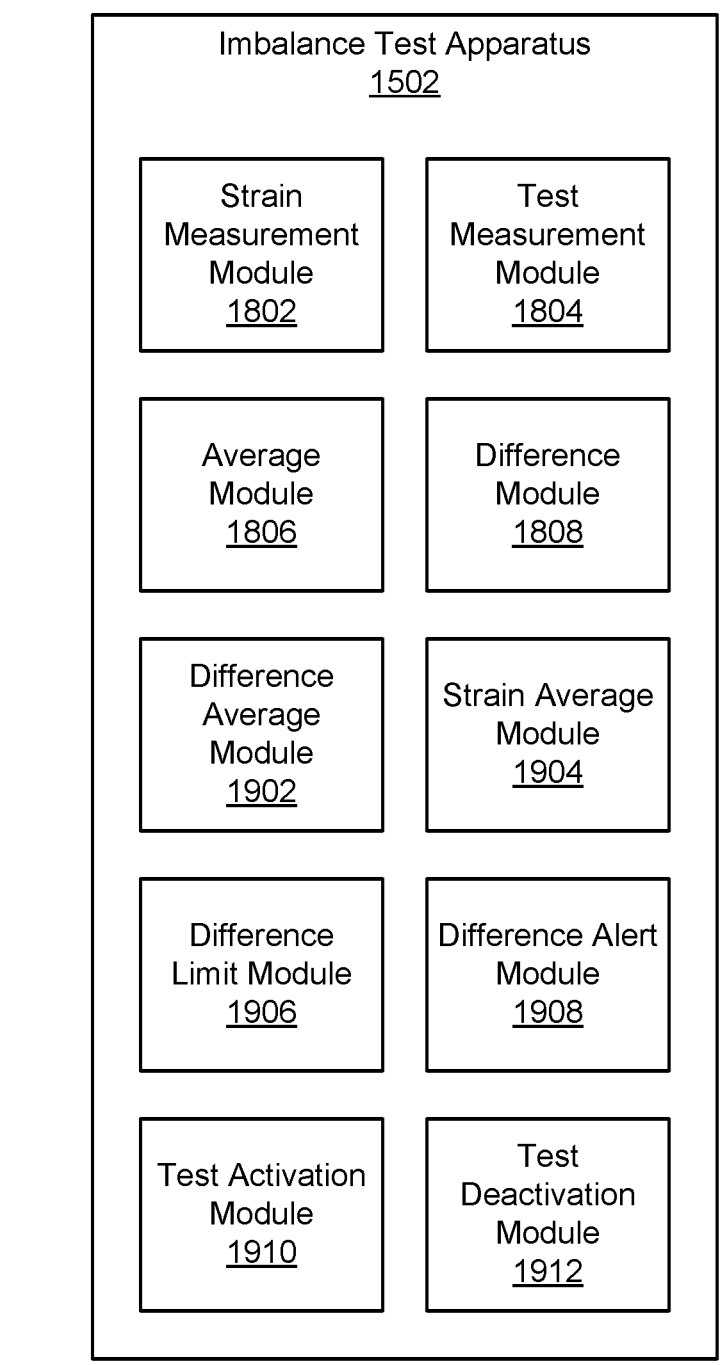
FIG. 19 is a schematic block diagram illustrating another embodiment of the imbalance test apparatus.

FIG. 19 is a schematic block diagram illustrating another embodiment 1900 of the imbalance test apparatus 1502. The embodiment 1800 includes a version of the imbalance test apparatus 1502 with a strain measurement module 1802, a test measurement module 1804, an average module 1806 and a difference module 1808, which are substantially similar to those described above in relation the embodiment 1800 of FIG. 18. The imbalance test apparatus 1502 includes, in various embodiments, one or more of a difference average module 1902, a strain average module 1904, a difference limit module 1906, a difference alert module 1908, a test activation module 1910 and a test deactivation module 1912, which are described below.

In some embodiments, the imbalance test apparatus 1502 includes a difference average module 1902 that determines an average difference voltage $V_{diff\ ave}$ from a plurality of difference voltages (e.g. $V_{diff1}$, $V_{diff2}$, etc.) measured by the difference module 1808. In other embodiments, the imbalance test apparatus 1502 includes a strain average module 1904 that determines an average strain voltage $V_{strain\ ave}$ from a plurality of strain voltages (e.g. $V_{strain1}$, $V_{strain2}$, $V_{strain3}$, etc.) measured by the strain measurement module 1802. In one embodiment, the average strain voltage $V_{strain\ ave}$, in one embodiment, is transmitted to a strain monitoring device, such as the processing device 214, which may use the average strain voltage $V_{strain\ ave}$ to determine if there is a cable pull or slack cable event.

In the embodiments, the test measurement module 1804 and the strain measurement module 1802 alternate measurements of voltage across terminals +IN, −IN of the strain gauge 1600 for a plurality of measurements, For each test measurement, the average module 1806 calculates an average strain voltage $V_{strain\ ave}$ from two strain voltage measurements (e.g. T0 and T1) measured preceding and after a particular test voltage measurement (e.g. I0) and the difference average module 1902 determines a difference voltage (e.g. $V_{diff1}$, $V_{diff2}$, $V_{diff3}$, $V_{diff4}$) corresponding to each test voltage (e.g. I0, I1, I2, I3). Each difference voltage (e.g. $V_{diff1}$) includes a difference between the average strain voltage (e.g. $V_{strain\ ave1}$) of the strain voltage T0 measured before the particular test measurement (e.g. I0) and the strain voltage T1 measured after the particular test measurement I0.

In some embodiments, the imbalance test apparatus 1502 includes a difference limit module 1906 that compares the average difference voltage $V_{diff\ ave}$ and a difference threshold. In some embodiments, the imbalance test apparatus 1502 includes a difference alert module 1908 that sends an alert if a magnitude of the average difference voltage $V_{diff\ ave}$ is greater than the difference threshold. For example, the imbalance test apparatus 1502 may record an initial average difference voltage $V_{diff\ ave}$, which may reflect resistances R of the strain gauge 1600 that are typical or expected values. The difference threshold may then be set based on the recorded initial average difference voltage $V_{diff\ ave}$. The difference threshold may be set to some percentage of the initial average difference voltage $V_{diff\ ave}$, such as 90%, which would correspond to a 10% change in the average difference voltage $V_{diff\ ave}$. Other difference thresholds may be used and one of skill in the art will recognize appropriate difference thresholds.

The alert may be in the form of an interrupt, an electronic message, a light, a wireless transmission to a receiver, etc. In one embodiment, the alert causes equipment controlled by the cable pull system 100 to stop. In another embodiment, the alert is sent to a computing device of a person that can take appropriate action. One of skill in the art will recognize other possible actions to be taken after an alert and other forms of an alert.

In some embodiments, the imbalance test apparatus 1502 includes a test activation module 1910 and a test deactivation module 1912. The test activation module 1910 connects the test resistor (e.g. $R_{test+}$) after the strain measurement module 1802 measures strain voltage $V_{strain}$ and prior to the test measurement module 1804 measuring a test voltage $V_{test}$. In one embodiment, the test activation module 1910 connects a test resistor $R_{test+}$ or $R_{test-}$ by closing a switch SW1 or SW2. In another embodiment, the test activation module 1910 times closing of the switch SW1 or SW2 to be after a strain voltage measurement and before a test voltage measurement.

The test deactivation module 1912 disconnects the test resistor (e.g. $R_{test+}$) after the test measurement module 1804 measures test voltage $V_{test}$ and prior to the strain measurement module 1802 measuring a strain voltage $V_{strain}$. In one embodiment, the test deactivation module 1912 disconnects a test resistor $R_{test+}$ or $R_{test-}$ by opening a switch SW1 or SW2. In another embodiment, the test deactivation module 1912 times opening of the switch SW1 or SW2 to be after a test voltage measurement and before a strain voltage measurement. The test activation module 1910 and the test deactivation module 1912 may control the switches SW1, SW2 by sending an electronic signal, such as causing a gate signal to transition high or low. In other embodiments, the test activation module 1910 and the test deactivation module 1912 send a digital signal which then controls opening and closing of the switches SW1, SW2.

In one embodiment, the test activation module 1910 and the test deactivation module 1912 connects and disconnects a first test resistor $R_{test+}$ in parallel with a resistor $R_3$ of the strain gauge 1900 connected between a first terminal +IN and a reference voltage or ground during a first imbalance test and connects a second test resistor $R_{test-}$ in parallel with a resistor $R_2$ of the strain gauge 1600 connected between a second terminal −IN and the reference voltage or ground during a second imbalance test. Each of the first imbalance test and the second imbalance test includes a plurality of test voltage measurements and strain voltage measurements.

Figure 20:
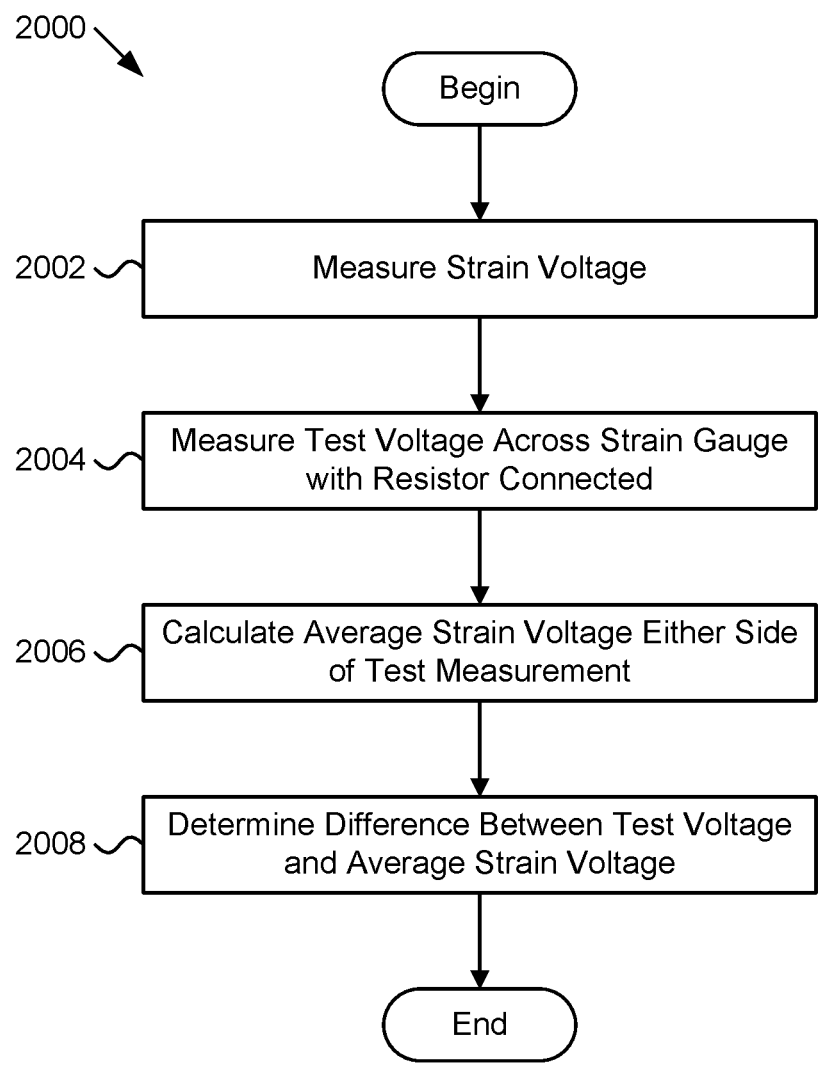
FIG. 20 is a schematic flow chart diagram illustrating one embodiment of a method for imbalance testing.

FIG. 20 is a schematic flow chart diagram illustrating one embodiment of a method 2000 for imbalance testing. The method 2000 begins and measures 2002 a strain voltage $V_{strain}$ across terminals (e.g. +IN, −IN) of a strain gauge 1600. The strain voltage $V_{strain}$ is representative of an amount of force on the strain gauge 1600. The method 2000 measures 2004 a test voltage $V_{test}$ across the terminals +IN, −IN of the strain gauge 1600 while a test resistor (e.g. $R_{test+}$) is connected in parallel with a resistor (e.g. $R_3$) of the strain gauge 1600. The test resistor $R_{test+}$ is connected while measuring the test voltage $V_{test}$ and disconnected while measuring the strain voltage $V_{strain}$.

The method 2000 calculates 2006 an average strain voltage $V_{strain\ ave}$ from two strain voltage measurements (e.g. T0, T1). The strain voltages T0, T1 are measured preceding and after the test voltage measurement (e.g. I0). The method 2000 determines 2008 a difference voltage $V_{diff}$ and the method 2000 ends. The difference voltage $V_{diff}$ is a difference between the average strain voltage $V_{strain\ ave}$ and the test voltage $V_{test}$. In one embodiment, the strain measurement module 1802, the test measurement module 1804, the average module 1806 and/or the difference module 1808 perform one or more of the steps of the method 2000.

Figure 21A:
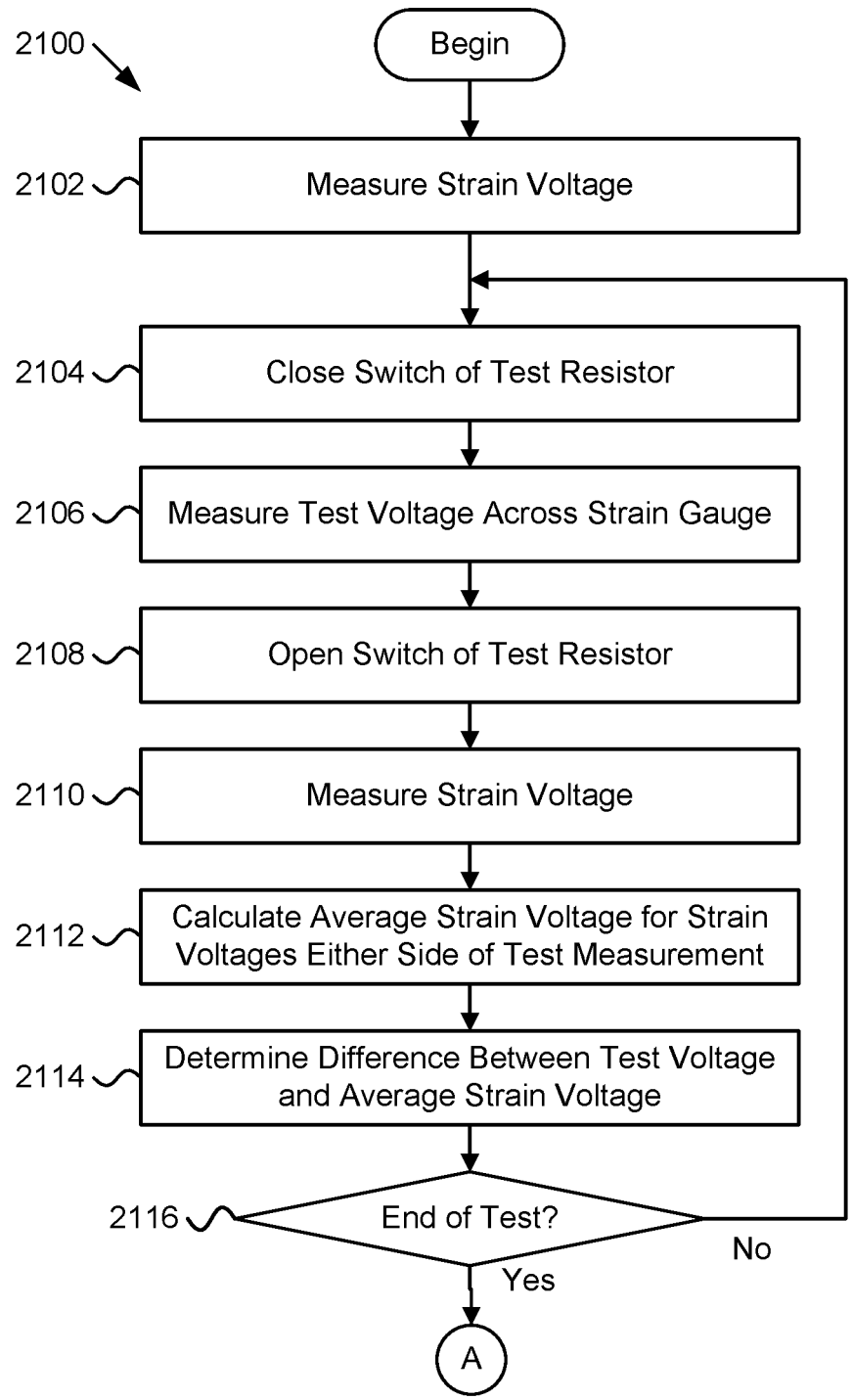
FIG. 21A is a first part of a schematic flow chart diagram illustrating another embodiment of a method for imbalance testing.
Figure 21B:
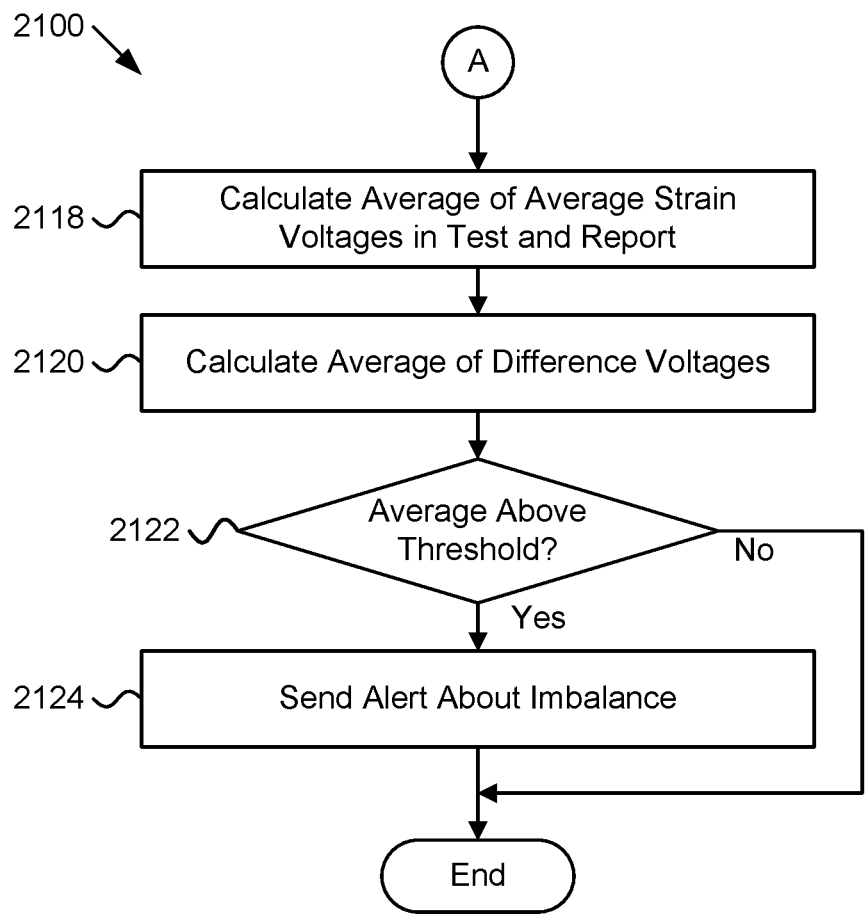
FIG. 21B is a second part of the schematic flow chart diagram illustrating another embodiment of a method for imbalance testing.

FIG. 21A is a first part and FIG. 21B is a second part of a schematic flow chart diagram illustrating another embodiment of a method 2100 for imbalance testing. The method 2100 begins and measures 2102 a strain voltage $V_{strain}$ across terminals (e.g. +IN, −IN) of a strain gauge 1600. The strain voltage $V_{strain}$ is representative of an amount of force on the strain gauge 1600. The method 2100 closes 2104 a switch (e.g. SW1) of a test resistor (e.g. $R_{test+}$) to connect the test resistor $R_{test+}$ in parallel with a resistor (e.g. $R_3$) of the strain gauge 1600. The method 2100 measures 2106 a test voltage $V_{test}$ across the terminals +IN, −IN of the strain gauge 1600 while the test resistor $R_{test+}$ is connected in parallel with the resistor $R_3$ of the strain gauge 1600. The method 2100 opens 2108 the test switch SW1 and again measures 2110 strain voltage $V_{strain}$.

The method 2100 calculates 2112 an average strain voltage (e.g. $V_{strain\ ave1}$) from two strain voltage measurements (e.g. T0, T1). The strain voltages T0, T1 are measured preceding and after the test voltage measurement (e.g. I0). The method 2100 determines 2114 a difference voltage $V_{diff}$. The difference voltage $V_{diff}$ is a difference between the average strain voltage $V_{strain\ ave}$ and the test voltage $V_{test}$. The method 2100 determines 2116 if an imbalance test has ended. For example, the imbalance test may end where there are five strain voltage measurements. If the method 2100 determines 2114 that the imbalance test has not ended, the method 2100 returns and closes 2104 the test switch SW1 and continues with measurement of a test voltage $V_{test}$, etc.

If the method 2100 determines 2116 that the imbalance test has ended, the method 2100 (follow "A" in FIG. 21A to "A" on FIG. 21B) calculates 2118 an average (e.g. $V_{strain\ ave}$) of the average strain voltages (e.g. $V_{strain\ ave1}$, $V_{strain\ ave2}$, $V_{strain\ ave3}$, $V_{strain\ ave4}$) and calculates 2120 an average (e.g. $V_{diff\ ave}$) of the difference voltages (e.g. $V_{diff1}$, $V_{diff2}$, $V_{diff3}$, $V_{diff4}$). The method 2100 determines 2122 if the average difference voltage $V_{diff\ ave}$ is above a difference threshold. If the method 2100 determines 2122 that the average difference voltage $V_{diff\ ave}$ is above the difference threshold, the method 2100 sends 2124 an alert, and the method 2100 ends. If the method 2100 determines 2122 that the average difference voltage $V_{diff\ ave}$ is not above a difference threshold, the method 2100 ends. In various embodiments, the strain measurement module 1802, the test measurement module 1804, the average module 1806, the difference module 1808, the difference average module 1902, the strain average module 1904, the difference limit module 1906, the difference alert module 1908, the test activation module 1910 and/or the test deactivation module 1912 perform one or more of the steps of the method 2100.

Although the invention or inventions are described throughout this disclosure in terms of various apparatuses, modules and devices, one of skill in the art will readily understand that the operational aspects and/or configurations disclosed herein may also be suitably described as one or more methods.

The described examples and embodiments are to be considered in all respects only as illustrative and not restrictive. This written description uses examples and embodiments to disclose the invention, including best mode, and also to enable any person skilled in the art to practice the invention, including making and using any devices or systems and performing any incorporated methods. The examples and embodiments may be practiced in other specific forms. The patentable scope of this invention is defined by the claims and may include other examples that occur to those skilled in the art. Such other examples are intended to be within the claims if they have structural elements that do not differ from the literal language of the claims, or if they include equivalent structural element with insubstantial differences from the literal languages of the claims.

What is claimed is:

1. An apparatus comprising:
   a strain measurement module that measures a strain voltage across terminals of a strain gauge, the strain voltage representative of an amount of force on the strain gauge;
   a test measurement module that measures a test voltage across the terminals of the strain gauge while a test resistor is connected in parallel with a resistor of the strain gauge, the test resistor connected while the test measurement module measures the test voltage and disconnected while the strain module measures strain voltage;
   an average module that calculates an average strain voltage from two strain voltage measurements, the strain voltages measured preceding and after the test voltage measurement;
   a difference module that determines a difference voltage, the difference voltage comprising a difference between the average strain voltage and the test voltage;
   a difference average module that determines an average difference voltage from a plurality of difference voltages measured by the difference module;
   a difference limit module that compares the average difference voltage and a difference threshold; and
   a difference alert module that sends an alert if a magnitude of the average difference voltage is greater than the difference threshold,
   wherein said modules comprise one or more of hardware circuits, a programmable hardware device and executable code, the executable code stored on one or more computer readable storage media.

2. The apparatus of claim 1, wherein the test measurement module and the strain measurement module alternate measurements of voltage across terminals of the strain gauge for a plurality of measurements and wherein, for each test measurement, the average module calculates an average strain voltage from two strain voltage measurements measured preceding and after a particular test voltage measurement and wherein the difference module determines a difference voltage corresponding to each test voltage, each difference voltage comprising a difference between the average strain voltage of the strain voltage measured before the particular test measurement and the strain voltage measured after the particular test measurement.

3. The apparatus of claim 2, further comprising:
a strain average module that determines an average strain voltage from a plurality of strain voltages measured by the strain measurement module, wherein the average strain voltage transmitted to a strain monitoring device.

4. The apparatus of claim 1, wherein, for each strain voltage measurement, the strain measurement module measures voltage of the strain gauge a plurality of times and averages the plurality voltages to determine the strain voltage, and wherein, for each test voltage measurement, the test measurement module measures voltage of the strain gauge a plurality of voltages and averages the plurality voltages to determine the test voltage.

5. The apparatus of claim 4, wherein the plurality of voltages measured by the strain measurement module comprises three voltages and wherein the plurality of voltages measured by the test measurement module comprises three voltage measurements.

6. The apparatus of claim 4, wherein the test measurement module and the strain measurement module alternate measurements of voltage of the strain gauge at a measurement sample rate and a rate of measurement of voltages by the strain measurement module for each strain voltage and by the test measurement module for each test voltage is much less than the measurement sample rate.

7. The apparatus of claim 1, wherein the test measurement module and the strain measurement module alternate measurements of voltage of the strain gauge at a measurement sample rate during an imbalance test, wherein the imbalance test results in a plurality of test voltage measurements and strain voltage measurements of a cycle of a fundamental frequency of power provided to the apparatus comprising the strain gauge.

8. The apparatus of claim 7, wherein a length of time of the imbalance test is within 10 percent of a cycle of the fundamental frequency.

9. The apparatus of claim 1, further comprising:
a test activation module that connects the test resistor after the strain measurement module measures strain voltage and prior to the test measurement module measuring a test voltage; and
a test deactivation module that disconnects the test resistor from the resistor of the strain gauge after the test measurement module measures the test voltage and prior to the strain measurement module measuring a next strain voltage.

10. The apparatus of claim 9, wherein the test activation module connects and the test deactivation module disconnects a first test resistor in parallel with a first resistor of the strain gauge during a first imbalance test and connects and disconnects a second test resistor in parallel with a second resistor of the strain gauge during a second imbalance test, wherein each of the first imbalance test and the second imbalance test comprise a plurality of test voltage measurements and strain voltage measurements.

11. The apparatus of claim 1, wherein the strain gauge measures force of a cable pull switch.

12. A method comprising:
measuring a strain voltage across terminals of a strain gauge, the strain voltage representative of an amount of force on the strain gauge;
measuring a test voltage across the terminals of the strain gauge while a test resistor is connected in parallel with a resistor of the strain gauge, the test resistor connected while measuring the test voltage and disconnected while measuring the strain voltage;
calculating an average strain voltage from two strain voltage measurements, the strain voltages measured preceding and after the test voltage measurement;
determining a difference voltage, the difference voltage comprising a difference between the average strain voltage and the test voltage;
determining an average difference voltage from a plurality of difference voltages;
comparing the average difference voltage and a difference threshold; and
sending an alert if a magnitude of the average difference voltage is greater than the difference threshold.

13. The method of claim 12, further comprising alternating measurements of test voltage and strain voltage for a plurality of measurements and wherein calculating an average strain voltage comprises, for each test measurement, calculating an average strain voltage from two strain voltage measurements measured preceding and after a particular test voltage measurement and wherein determining a difference voltage comprises determining a difference voltage corresponding to each test voltage, each difference voltage comprising a difference between the average strain voltage of the strain voltage measured before the particular test measurement and the strain voltage measured after the particular test measurement.

14. The method of claim 12, wherein, for each strain voltage measurement, further comprising measuring voltage of the strain gauge a plurality of times and averaging the plurality voltages to determine the strain voltage, and wherein, for each test voltage measurement, further comprising measuring voltage of the strain gauge a plurality of voltages and averaging the plurality voltages to determine the test voltage.

15. The method of claim 12, further comprising:
connecting the test resistor after measuring strain voltage and prior to measuring a test voltage; and
disconnecting the test resistor from the resistor of the strain gauge after measuring the test voltage and prior to measuring a next strain voltage.

16. A cable pull switch system comprising:
a strain gauge in mechanical communication with a cable, the strain gauge measuring force on the cable;
a strain measurement module that measures strain voltage across terminals of the strain gauge, the strain voltage representative of an amount of force on the strain gauge;
a test measurement module that measures a test voltage across the terminals of the strain gauge while a test resistor is connected in parallel with a resistor of the strain gauge, the test resistor connected while the test measurement module measures the test voltage and disconnected while the strain module measures strain voltage;
an average module that calculates an average strain voltage from two strain voltage measurements, the strain voltages measured preceding and after the test voltage measurement; and
a difference module that determines a difference voltage, the difference voltage comprising a difference between the average strain voltage and the test voltage;
a difference average module that determines an average difference voltage from a plurality of difference voltages measured by the difference module;
a difference limit module that compares the average difference voltage and a difference threshold;

a difference alert module that sends an alert if a magnitude of the average difference voltage is greater than the difference threshold, wherein said modules comprise one or more of hardware circuits, a programmable hardware device and executable code, the executable code stored on one or more computer readable storage media.

17. The system of claim 16, wherein the test measurement module and the strain measurement module alternate measurements of voltage across terminals of the strain gauge for a plurality of measurements and wherein, for each test measurement, the average module calculates an average strain voltage from two strain voltage measurements measured preceding and after a particular test voltage measurement and wherein the difference module determines a difference voltage corresponding to each test voltage, each difference voltage comprising a difference between the average strain voltage of the strain voltage measured before the particular test measurement and the strain voltage measured after the particular test measurement, and further comprising:

a strain average module that determines an average strain voltage from a plurality of strain voltages measured by the strain measurement module, wherein the average strain voltage transmitted to a strain monitoring device.

* * * * *